(12) United States Patent
Ikriannikov

(10) Patent No.: US 8,674,798 B2
(45) Date of Patent: Mar. 18, 2014

(54) LOW PROFILE INDUCTORS FOR HIGH DENSITY CIRCUIT BOARDS

(75) Inventor: Alexandr Ikriannikov, Castro Valley, CA (US)

(73) Assignee: Volterra Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/344,934

(22) Filed: Jan. 6, 2012

(65) Prior Publication Data

US 2012/0103672 A1    May 3, 2012

Related U.S. Application Data

(63) Continuation of application No. 12/940,933, filed on Nov. 5, 2010, now Pat. No. 8,299,882, which is a continuation-in-part of application No. 12/507,751, filed on Jul. 22, 2009, now Pat. No. 8,040,212.

(51) Int. Cl.
    *H01F 27/29* (2006.01)

(52) U.S. Cl.
    USPC .......................................................... 336/192

(58) Field of Classification Search
    USPC ............................... 336/65, 192, 200, 232, 83
    See application file for complete search history.

(56) References Cited

U.S. PATENT DOCUMENTS

| | | |
|---|---|---|
| 3,988,665 A | 10/1976 | Neumaier et al. |
| 4,455,545 A | 6/1984 | Shelly |
| 4,543,554 A | 9/1985 | Muellenheim et al. |
| 4,777,406 A | 10/1988 | Ross et al. |
| 4,800,479 A | 1/1989 | Bupp |
| 4,935,710 A | 6/1990 | Yamazaki et al. |
| 5,023,578 A | 6/1991 | Kaneko et al. |
| 5,161,098 A | 11/1992 | Balakrishnan |
| 5,225,971 A | 7/1993 | Spreen |
| 5,353,001 A | 10/1994 | Meinel et al. |
| 5,436,818 A | 7/1995 | Barthold |

(Continued)

FOREIGN PATENT DOCUMENTS

| | | |
|---|---|---|
| EP | 1 632 964 | 3/2006 |
| EP | 1 833 165 | 9/2007 |

(Continued)

OTHER PUBLICATIONS

U.S. Appl. No. 12/940,933, Issue Fee payment, filed Sep. 27, 2012, 2 pages.

(Continued)

*Primary Examiner* — Tuyen Nguyen
(74) *Attorney, Agent, or Firm* — Lathrop & Gage LLP

(57) ABSTRACT

An inductor includes a core formed of a magnetic material and a foil winding wound at least partially around or through at least a portion of the core. A first end of the winding extends away from the core to form an extended output tongue configured and arranged to supplement or serve as a substitute for a printed circuit board foil trace. A second end of the winding fauns a solder tab. At least a portion of the extended output tongue and the solder tab are formed at a same height relative to a bottom surface of the core. Another inductor includes a core formed of a magnetic material, a winding wound at least partially around or through at least a portion of the core, and a ground return conductor attached to the core. The core does not form a magnetic path loop around the ground return conductor.

32 Claims, 30 Drawing Sheets

(56) References Cited

U.S. PATENT DOCUMENTS

| | | | |
|---|---|---|---|
| 5,469,334 | A | 11/1995 | Balakrishnan |
| 5,565,837 | A | 10/1996 | Godek et al. |
| 5,568,111 | A | 10/1996 | Metsler |
| 5,574,420 | A | 11/1996 | Roy et al. |
| 5,631,822 | A | 5/1997 | Silberkleit et al. |
| 5,737,203 | A | 4/1998 | Barrett |
| 5,939,966 | A | 8/1999 | Shin' Ei |
| 6,060,977 | A | 5/2000 | Yamamoto et al. |
| 6,114,932 | A | 9/2000 | Wester et al. |
| 6,147,584 | A | 11/2000 | Shin'el |
| 6,198,375 | B1 | 3/2001 | Shafer |
| 6,204,744 | B1 | 3/2001 | Shafer et al. |
| 6,342,778 | B1 | 1/2002 | Catalano et al. |
| 6,348,848 | B1 | 2/2002 | Herbert |
| 6,356,179 | B1 | 3/2002 | Yamada |
| 6,362,986 | B1 | 3/2002 | Schultz et al. |
| 6,377,155 | B1 | 4/2002 | Allen et al. |
| 6,420,953 | B1 | 7/2002 | Dadafshar |
| 6,449,829 | B1 | 9/2002 | Shafer |
| 6,460,244 | B1 | 10/2002 | Shafer et al. |
| 6,477,414 | B1 | 11/2002 | Silvian |
| 6,549,111 | B1 | 4/2003 | De Graaf et al. |
| 6,578,253 | B1 | 6/2003 | Herbert |
| 6,765,468 | B2 | 7/2004 | Chen et al. |
| 6,867,678 | B2 | 3/2005 | Yang |
| 6,903,648 | B2 | 6/2005 | Baumann et al. |
| 7,023,314 | B2 * | 4/2006 | Tolle et al. ............ 336/192 |
| 7,034,645 | B2 | 4/2006 | Shafer et al. |
| 7,187,263 | B2 | 3/2007 | Vinciarelli |
| 7,199,695 | B1 | 4/2007 | Zhou et al. |
| 7,248,139 | B1 | 7/2007 | Podlisk et al. |
| 7,280,025 | B2 | 10/2007 | Sano |
| 7,310,039 | B1 | 12/2007 | Zhang |
| 7,352,269 | B2 | 4/2008 | Li et al. |
| 7,492,246 | B2 * | 2/2009 | Chang ..................... 336/192 |
| 7,498,920 | B2 | 3/2009 | Sullivan et al. |
| 7,525,406 | B1 | 4/2009 | Cheng |
| 7,649,434 | B2 | 1/2010 | Xu et al. |
| 7,994,888 | B2 | 8/2011 | Ikriannikov |
| 2001/0043135 | A1 | 11/2001 | Yamada et al. |
| 2002/0067234 | A1 | 6/2002 | Kung |
| 2002/0093413 | A1 | 7/2002 | Shin 'ei |
| 2004/0017276 | A1 | 1/2004 | Chen et al. |
| 2005/0128040 | A1 | 6/2005 | Gray et al. |
| 2006/0049907 | A1 | 3/2006 | Liu |
| 2006/0089022 | A1 | 4/2006 | Sano |
| 2006/0145800 | A1 | 7/2006 | Dadafshar et al. |
| 2006/0158297 | A1 | 7/2006 | Sutardja |
| 2007/0175701 | A1 | 8/2007 | Xu et al. |
| 2007/0176726 | A1 | 8/2007 | Xu et al. |
| 2007/0268104 | A1 | 11/2007 | Chan et al. |
| 2008/0012674 | A1 | 1/2008 | Sano et al. |
| 2008/0136576 | A1 | 6/2008 | Emmons et al. |
| 2008/0150666 | A1 | 6/2008 | Chandrasekaran et al. |
| 2008/0205098 | A1 | 8/2008 | Xu et al. |
| 2008/0211613 | A1 * | 9/2008 | Lin et al. ................ 336/83 |
| 2008/0303624 | A1 | 12/2008 | Yamada et al. |
| 2009/0179723 | A1 | 7/2009 | Ikriannikov et al. |
| 2009/0231081 | A1 | 9/2009 | Ikriannikov et al. |
| 2009/0237197 | A1 | 9/2009 | Ikriannikov et al. |
| 2010/0007453 | A1 | 1/2010 | Yan et al. |
| 2010/0013587 | A1 | 1/2010 | Yan et al. |
| 2010/0271161 | A1 | 10/2010 | Yan et al. |
| 2012/0056704 | A1 | 3/2012 | Nagano et al. |

FOREIGN PATENT DOCUMENTS

| | | |
|---|---|---|
| JP | 08-250332 | 9/1996 |
| JP | 2000-164431 | 6/2000 |
| JP | 2002057049 | 2/2002 |
| WO | WO 2006/026674 | 3/2006 |

OTHER PUBLICATIONS

PCT/US11/59193, International Search Report and Written Opinion of Mar. 27, 2012, 9 pages.

Notice of Allowance issued in U.S. Appl. No. 13/175,726, dated Sep. 21, 2012, 12 pages.

Office Action issued in U.S. Appl. No. 13/175,726, dated May 30, 2012, 14 pages.

Response to Office Action filed in U.S. Appl. No. 13/175,726, dated Aug. 30, 2012, 15 pages.

Notice of Allowance issued in related U.S. Appl. No. 12/940,933, dated Jun. 27, 2012, 18 pages.

Wong, Pit-Leong, et al., "Investigating Coupling Inductors in the Interleaving QSW VRM" Applied Power Electronics Conference and Exposition, 2000. APEC 2000. Fifteenth Annual IEEE; Mar. 2000; pp. 973-978.

Wong, Pit-Leong, et al.; A Novel Modeling Concept for Multi-coupling Core Structures; Center for Power Electronics Systems; IEEE; pp. 107; 2001.

Wong, Pit-Leong, et al.; Performance Improvements of Interleaving VRMs With Coupling Inductors, IEEE Transactions on Power Electronics; vol. 16, No. 4; pp. 499-507; Jul. 2001.

Xu, J., et al; Analysis by Finite Element Method of a Coupled Inductor Circuit Used as Current Injection Interface; IEEE Workshop on Computers in Power Electronics; pp. 147-151; 1996.

Cooper Bussmann, "Product Data Sheet for Low Profile Inductor (Surface Mount)" retrieved from http://www.angliac.com, May 2003.

Pulse, SMT Power Inductors Power Beads—PA0766NL Series; pp. 53-55; Mar. 2006.

Vitec, Dual High Frequency High Power Inductor, AF4390A data sheet; date unknown.

Dong et al., Twisted Core Coupled Inductors for Microprocessor Voltage Regulators, Power Electronics Specialists Conference, pp. 2386-2392, Jun. 17-21, 2007.

Dong et al., The Short Winding Path Coupled Inductor Voltage Regulators, Applied Power Electronics Conference and Exposition, pp. 1446-1452, Feb. 24-28, 2008.

Dong et al., Evaluation of Coupled Inductor Voltage Regulators, Applied Power Electronics Conference and Exposition, pp. 831-837, Feb. 24-28, 2008.

Pulse, SMT Power Inductors datasheet, 2 pages, Nov. 2007.

PCT/US10/42938 International Search Report & Written Opinion mailed Dec. 2, 2010, 18 pages.

U.S. Appl. No. 12/643,957, Notice of Allowance mailed Jun. 13, 2011, 8 pages.

U.S. Appl. No. 12/643,957, Response to Office Action filed May 23, 2011, 19 pages.

U.S. Appl. No. 12/643,957, Office Action mailed Feb. 23, 2011, 7 pages.

U.S. Appl. No. 12/507,751, Response to Office Action filed May 23, 2011, 23 pages.

U.S. Appl. No. 12/507,751, Office Action mailed Feb. 23, 2011, 11 pages.

PCT/US10/60869, International Search Report and Written Opinion mailed May 13, 2011, 14 pages.

U.S. Appl. No. 12/643,957, Issue Fee payment submitted Jun. 28, 2011, 2 pages.

U.S. Appl. No. 12/507,751, Notice of Allowance dated Jul. 6, 2011, 13 pages.

U.S. Appl. No. 12/507,751, Issue Fee payment submitted Sep. 12, 2011, 2 pages.

U.S. Appl. No. 13/297,216, Non-Final Rejection issued Jun. 5, 2013, 9 pages.

U.S. Appl. No. 13/297,216, Response to Non-Final Rejection filed Sep. 5, 2013, 6 pages.

* cited by examiner

LOW PROFILE INDUCTORS FOR HIGH DENSITY CIRCUIT BOARDS

CROSS-REFERENCE TO RELATED APPLICATIONS

This application is a continuation of U.S. patent application Ser. No. 12/940,933 filed Nov. 5, 2010 now U.S. Pat. No. 8,299,882, which is a continuation-in-part of U.S. patent application Ser. No. 12/507,751 filed Jul. 22, 2009, now U.S. Pat. No. 8,040,212. Both of the above-mentioned applications are incorporated herein by reference.

FIELD

The present document relates to the field of low profile inductor design for high-density printed circuit boards. In particular, the document relates to a low profile inductor suitable for use beneath processor heat sinks and in other areas where conventional inductors may interfere with other components.

BACKGROUND

Many high density printed circuit board assemblies (PCBs) are installed in tight housings, or have bulky components attached to them, such that component height in portions of the PCB must be limited. For example, in the area near a processor of a personal computer motherboard, component height must be limited to avoid mechanical interference with processor heat sinks. Similarly, high profile components on PCMCIA or Cardbus devices are undesirable because they may require the device to occupy two slots in a laptop computer's connector instead of a single slot; occupancy of multiple slots may limit further system expandability and may prevent use with machines having only a single slot available.

Voltage regulated down-converters for providing power to microprocessor integrated circuits of laptop and desktop personal computers are known. Such converters typically include one or more inductors.

SUMMARY

In an embodiment, an inductor for assembly on a printed circuit board includes a core formed of a magnetic material and a first foil winding wound at least partially around or through at least a portion of the core. A first end of the first winding extends away from the core to form a first extended output tongue, and a second end of the first winding forms a solder tab. The solder tab and at least a portion of the first extended output tongue are formed at a same height relative to a bottom surface of the core for surface mount attachment to the printed circuit board. The first extended output tongue is configured and arranged to supplement or serve as a substitute for a first foil trace disposed on a surface of the printed circuit board.

In an embodiment, an inductor for assembly on a printed circuit board includes a core formed of a magnetic material, a first winding wound at least partially around or through at least a portion of the core, and a first ground return conductor attached to the core. The first winding and the first ground return conductor are configured and arranged such that inductance of the first ground return conductor is not significantly increased by presence of the core, while inductance of the first winding is significantly increased by presence of the core, relative to an otherwise identical inductor without the core.

In an embodiment, an inductor for assembly on a printed circuit board includes an elongated ground return conductor forming at least one solder tab at each end of the conductor. The inductor further includes at least two spacer elements disposed on the ground return conductor and an elongated foil winding forming at least one solder tab at each end of the winding. The winding is disposed on the spacer elements such that the spacer elements separate the ground return conductor from the winding to create a channel between the ground return conductor and the winding.

In an embodiment, a printed circuit board assembly has a drop-in inductor attached to a printed circuit board. The drop-in inductor includes a first foil winding wound through an opening in a magnetic core and a first ground return conductor attached to the core. The first foil winding and the first ground return conductor are configured and arranged such that inductance of the first ground return conductor is not significantly increased by presence of the core, while inductance of the first foil winding is significantly increased by presence of the core, relative to an otherwise identical inductor without the core. The first foil winding and the first ground return conductor have ends formed as solder tabs for attachment to the printed circuit board, and the tabs of the first foil winding and the first ground return conductor are formed at a same height relative to a bottom surface of the core. The tabs of the first foil winding and the tabs of the first ground return conductor are attached to foil of the same layer of the printed circuit board. The printed circuit board forms an aperture, and the core of the inductor extends into the aperture.

In an embodiment, a printed circuit board assembly includes a printed circuit board, at least one switching device attached to the printed circuit board, and an inductor attached to the printed circuit board. The inductor includes a core formed of a magnetic material and a foil winding wound at least partially around or through at least a portion of the core. A first end of the winding extends away from the core to form an extended input tongue. At least a portion of the extended input tongue is soldered to and supplements a first foil trace disposed on an outer surface of the printed circuit board, where the first foil trace electrically couples the at least one switching device to the first end of the winding.

In an embodiment, a printed circuit board assembly includes a printed circuit board, at least one switching device attached to the printed circuit board, and an inductor attached to the printed circuit board. The inductor includes a core formed of a magnetic material and a foil winding wound at least partially around or through at least a portion of the core. A first end of the winding is electrically coupled to the at least one switching device, and a second end of the winding extends away from the core to form an extended output tongue. At least a portion of the extended output tongue is soldered to and supplements a first foil trace disposed on an outer surface of the printed circuit board.

In an embodiment, an inductor for assembly on a printed circuit board includes a core formed of a magnetic material and a winding. The core has a first side and a second side opposite to the first side. A linear separation distance between the first and second sides of the core defines a length of the core. The winding includes (a) a core winding portion wound through the core, (b) a foil input tongue at the first side of the core and extending away from the core in the lengthwise direction, and (c) a foil output tongue at the second side of the core and extending away from the core in the lengthwise direction. At least a portion of the foil input tongue and the foil output tongue are formed at a same height relative to a bottom surface of the core for surface mount attachment to the printed circuit board, where the height is generally perpendicular to the lengthwise direction.

DETAILED DESCRIPTION OF THE EMBODIMENTS

Figure 1:
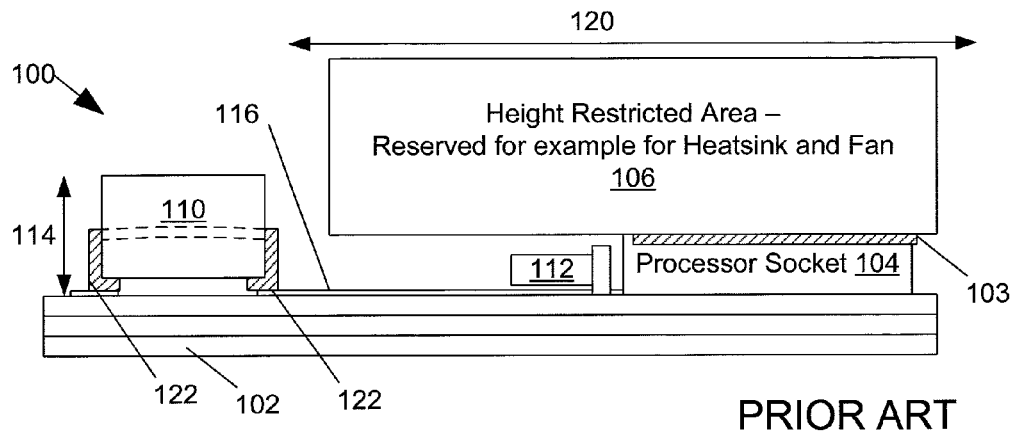
FIG. 1 illustrates a PRIOR ART cross section of a motherboard.

It is noted that, for purposes of illustrative clarity, certain elements in the drawings may not be drawn to scale. Specific instances of an item may be referred to by use of a numeral in parentheses (e.g., winding 1802(1)) while numerals without parentheses refer to any such item (e.g., windings 1802).

In a high density printed circuit board assembly, such as a processor motherboard 100 assembly (FIG. 1) as used in a personal computer, there may be portions of the assembly where circuit height is restricted, yet devices in or near these areas may require considerable power. For example, motherboard 100 assembly may have a multilayer printed circuit board 102 with an attached processor 103 in a processor socket 104. Since processor 103 may dissipate considerable power—in some cases exceeding a hundred watts at peak computer performance—a heat sink and fan assembly 106 is attached to processor 103 to cool processor 103. Heat sink and fan assembly 106 is often a large, bulky, device requiring a considerable keep-out zone 120 beneath it where only low-profile components are allowed on motherboard 100 to prevent components on motherboard 100 from mechanically interfering with heat sink and fan assembly 106.

In some systems, heat sink and fan assembly 106 may actually occupy only some of the space shown; however a system manufacturer may have reserved a larger volume to allow air to flow into the heat sink, and to allow for future use of a different heat sink or fan with future, faster, and even more power-hungry, processors. In other systems and subsystems, such as PCMCIA or CARDBUS cards, height restrictions may derive from other factors such as overall card or system dimensions. Further, component height is strictly limited in laptop systems because of desires to limit machine thickness.

Processor 103 draws considerable current since much of the power it consumes is at a low "core" voltage, typically between one and two volts, although voltage at the processor's "periphery" may be higher. The "core" voltage is typically provided by an on-board DC-to-DC down-converter. The DC-to-DC converter has one or more inductors, such as inductor 110, as well as several capacitors 112. Inductor 110 often has height 114 that would interfere with heat sink and fan assembly 106 if inductor 110 were located under heat sink and fan assembly 106. Inductor 106 is therefore located some distance away from processor socket 104. Similar situations may also arise with high performance graphics chips as these also consume considerable power and often require heat sinks.

Figure 2:
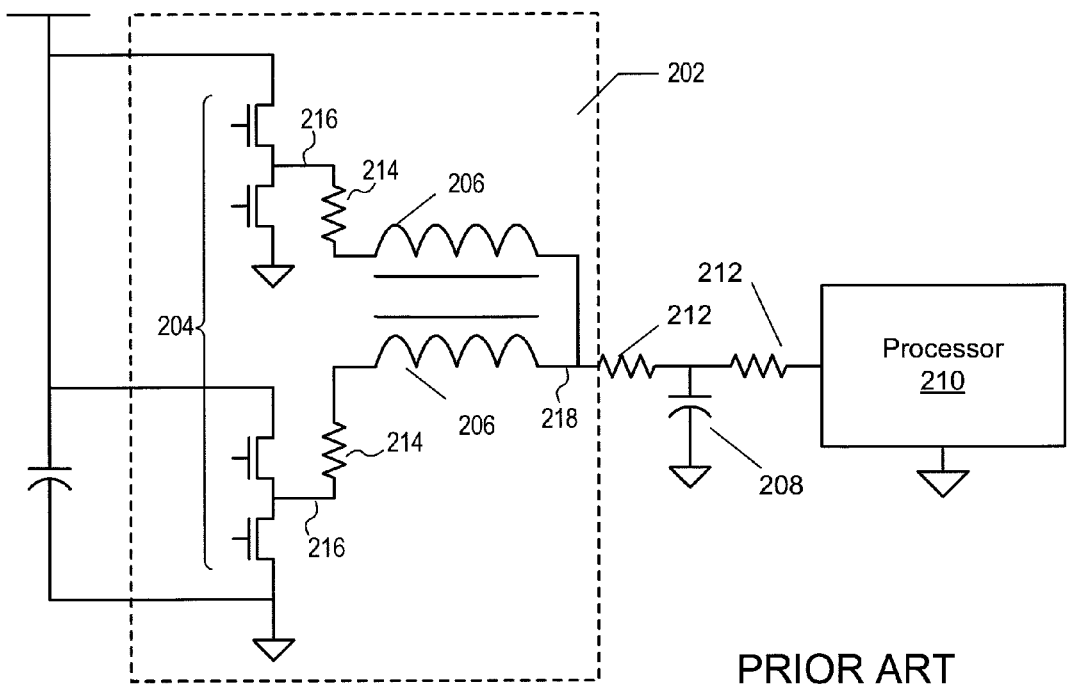
FIG. 2 is a schematic of a PRIOR ART motherboard.

A schematic diagram (FIG. 2) illustrates the resulting problem of parasitic impedance. Down-converter 202 is, in this example, a multiphase buck converter having switching devices 204 that rapidly alternate a connection to each of several phase inductors 206 between a powered, a grounded, and an unpowered state. Switching devices 204 connect to respective phase inductors 206 via respective switching nodes (Vx) 216. Current builds in each phase inductor 206 when it is powered, and decays when it is grounded. Output voltage and current are a function of the percentage of time that each phase inductor 206 is powered. Phase inductors 206 may be magnetically coupled, as shown in FIG. 2.

Output terminals of the phase inductors 206 are coupled together and to capacitors 208 and processor 210 via an output node (Vo) 218. If the connection from phase inductors 206 to capacitor 208 and processor 210 is made only via a typical thin foil PCB trace (e.g., trace 116 FIG. 1), significant unintended, parasitic, impedances 212 may exist between processor 210, capacitor 208, and converter inductors 206. Impedances 212 may have an inductive and a resistive component.

The low processor voltage, typically between one and two volts, and high processor current, often reaching peak currents of fifty to one hundred amperes, make the system quite sensitive to what may seem quite low parasitic impedances 212. For example, a current of one hundred amperes in a two-milliohm parasitic impedance is sufficient to provide a two hundred-millivolt drop; at a one volt core voltage, this may represent twenty percent of operating voltage. Such voltage drop due to the hundred amperes also relates to twenty watts of conduction loss and is environmentally undesirable, as this conduction loss represents power not used in the circuit, but is power used to produce heat wasted in the board layout.

It is desirable to minimize impedances 212, since these may not only waste power, but may allow processor 210 voltage to deviate outside desirable operating limits. The same arguments apply to parasitic impedances 214 between inductors 206 and power semiconductors 204, it is desirable to minimize these impedances also.

To minimize parasitic resistances in inductors 206, these inductors are often wound with one or just a few turns of thick foil (i.e., a conductive material such as copper having at least a substantially rectangular cross-section) or wire around or inside a powdered iron, ferrite, or similar ferromagnetic core suitable for use at the high frequencies—in the range 20 kHz to above 1 MHz—at which switching devices 204 typically operate. Multiple inductors 206 are often used, their outputs being connected in parallel and operated as a multiphase converter, to handle the requisite current. The foil with which inductors 206 are wound is typically significantly thicker than foil used for traces 116 on the PCB. In the embodiment of FIG. 1, the foil of the inductor extends, typically downwards and often wrapping under the core, to form a solder tab 122 that connects to foil of PCB traces 116.

Figure 3:
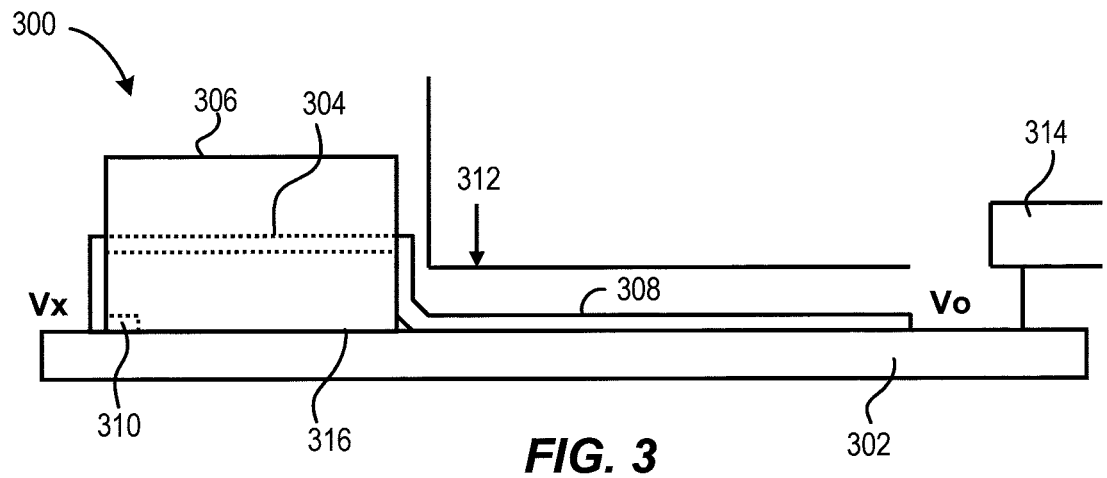
FIG. 3 shows a side plan view of one inductor installed on a PCB, according to an embodiment.
Figure 4:
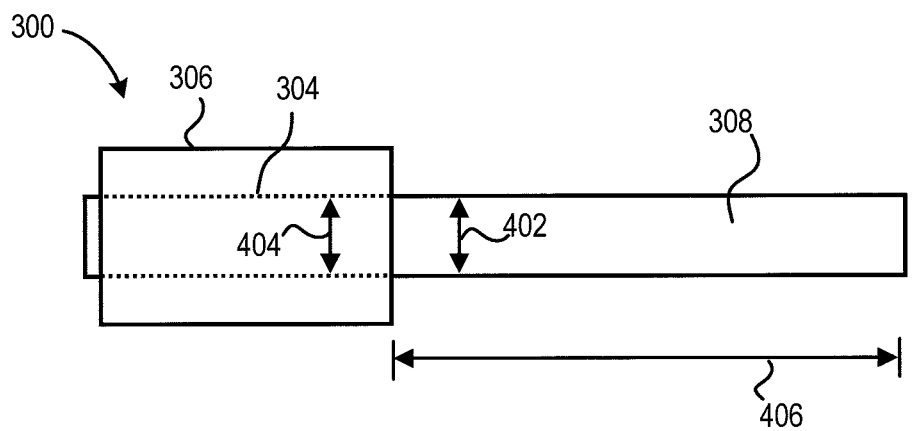
FIG. 4 shows a top plan view of the inductor of FIG. 3.

FIG. 3 shows a side plan view of one inductor 300 installed on a PCB 302, and FIG. 4 shows a top plan view of inductor 300. Inductor 300, for example, is used to at least partially solve one or more of the problems discussed above, and inductor 300 may be used in DC-to-DC converter applications (e.g., as a buck converter output inductor). Inductor 300 includes at least one electrically conductive winding 304 wound at least partially around or through at least a portion of a magnetic core 306. For example, winding 304 may be wound through an opening in core 306, such as shown in FIGS. 3 and 4, where dashed lines indicate the outline of winding 304 where obscured core 306. Core 306 is, for example, formed of a ferrite and/or powdered iron material, and may consist of one or multiple magnetic elements. In an embodiment, winding 304, for example, is a single turn "staple" foil winding, thereby helping to minimize winding length and resistance.

Inductor 300 further includes an extended output tongue 308 extending away from core 306. Extended output tongue 308 has a thickness similar to that of winding 304, and extended output tongue 308 is electrically coupled to one end of winding 300. Extended output tongue 308 is, for example, an extension of winding 304—such configuration may help simplify construction of inductor 300 and/or reduce combined resistance of winding 304 and extended output tongue 308. At least a portion of extended output tongue 308 is configured for attaching (e.g., soldering) to a foil PCB trace or solder pad. Although extended output tongue 308 is shown as having a width 402 which is the same as a width 404 of the portion of winding 304 that passes through or at least partially around core 306, widths 402 and 404 may differ. For example, width 402 may be greater than width 404 to help minimize impedance of extended output tongue 308. In motherboard applications, extended output tongue 308 is typically electrically coupled to an output node (e.g., a buck converter output node). However, inductor 300 is not limited to such uses. For example, extended output tongue 308 could couple to a power supply intermediate node.

Inductor 300 further includes a solder tab 310 electrically coupled to the other end of winding 304, for soldering to a foil PCB solder pad. In motherboard applications, solder tab 310 is typically coupled to an input node (e.g., a switching node in a buck converter). In alternative embodiments, solder tab 310 could alternately be replaced by a different type of connector, such as a through-hole pin.

At least a portion of extended output tongue 308 and solder tab 310 are, for example, formed at the same height relative to a bottom surface 316 of core 306 to facilitate surface mount connection of inductor 300 to a PCB. Some of such embodiments are capable of being placed on a PCB using pick-and-place equipment and soldered to traces or solder pads of the PCB using reflow soldering techniques (e.g., infrared reflow, hot gas convection, vapor phase reflow) or wave soldering techniques.

Figure 5:
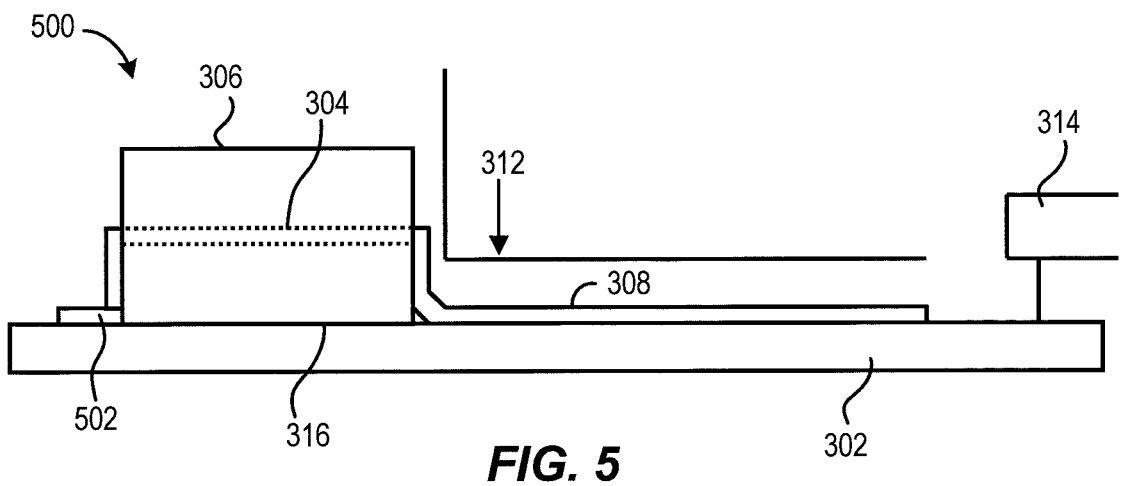
FIG. 5 shows a side plan view of another embodiment of the inductor of FIG. 3 installed on a PCB.

In some embodiments, solder tab 310 is replaced with an extended input tongue. For example, FIG. 5 shows a side plan view of one inductor 500 installed on PCB 302. Inductor 500 is an embodiment of inductor 300 where solder tab 310 has been replaced with a extended input tongue 502. At least respective portions of extended output tongue 308 and extended input tongue 502 are, for example, formed at the same height relative to bottom surface 316 of core 306 to facilitate surface mount connection of inductor 500 to a PCB. Extended input tongue 502 is, for example, an extension of winding 304. Extended input tongue 502 typically has mechanical characteristics (e.g., width, thickness) similar to that of extended output tongue 308. However, extended input tongue 502 is shorter in most embodiments of inductor 500 than extended output tongue 308 because switching devices are typically located near core 306 of inductor 500.

Extended output tongue 308 may be used to provide a low impedance electrical connection to inductor 300. For example, extended output tongue 308 may be configured and arranged for supplementing a foil PCB trace connected to inductor 300. In some embodiments, at least a portion of extended output tongue 308 is formed for soldering to and extending along a foil trace on a PCB outer surface, thereby serving as a conductor in parallel with the trace. Extended output tongue 308 typically has a thickness that is much greater than that of the PCB trace—accordingly, extended output tongue 308 typically has a much lower electrical and thermal impedance than the PCB trace. Extending extended output tongue 308 along a PCB trace to supplement the trace may significantly lower the trace's effective impedance, thereby reducing voltage drop and power loss in the trace, as well as improving the trace's heat sink ability. As another example, extended output tongue 308 may be used in place of a PCB trace to provide a low impedance electrical connection to one end of winding 304, and thereby free up a PCB layer for other uses, such as to route signal traces. Similarly, extended input tongue 502 (FIG. 5) may also supplement or be used in place of a PCB trace to provide a low impedance electrical connection to winding 304.

Extended output tongue 308 may also serve as a heat sink, thereby helping to cool inductor 300 and a PCB that tongue 308 is attached to. Extended output tongue 308 also typically has a low profile, which may advantageously allow use of rework equipment, pick and place equipment, and/or test probes in the vicinity of tongue 308. Furthermore, because extended output tongue 308 is part of inductor 300, extended output tongue 308 may withstand pressure from hot air rework equipment without being blown off a PCB.

In typical embodiments, winding 304 and extended output tongue 308 are formed of copper foil, such as between three and five millimeters wide, and from two tenths to one half millimeter thick. It is desirable for width 402 of extended output tongue 308 to be at least 1 millimeter to promote low impedance of tongue 308. The foil winding material typically used for winding 304 and extended output tongue 308 is substantially thicker than typical PCB copper foils (e.g., trace 116, FIG. 1) because half-ounce copper foil, as is typically used in PCB layers requiring fine lines, is approximately eighteen thousandths of a millimeter thick. Even three ounce copper foil, which may be used on special-purpose power and ground-plane layers, is only about a tenth of a millimeter thick. Since direct-current sheet-resistivity of a copper conductor is inversely proportional to its thickness, the sheet-resistivity of extended output tongue 308 may be as little as one-fiftieth that of a bare PCB trace of equivalent length and width. Extended output tongue 308 typically has length 406 of at least one centimeter to bridge a distance between inductor 300 and another component or portion of a PCB. However, extended output tongue 308 could be significantly shorter (e.g., two millimeters) if it only needs to run a short distance. Inductors including shorter extended tongues are typically easier to manufacture and assemble than inductors including longer extended tongues.

FIG. 3 shows one possible use of inductor 300 in an application having a height restriction 312 (e.g., due to a heat sink assembly). In the example of FIG. 3, inductor 300 is connected between a DC-to-DC converter (e.g., buck converter) switching node Vx (e.g., node 216, FIG. 2), and a converter output node Vo (e.g., node 218, FIG. 2). A load 314 (e.g., a processor) is powered from output node Vo. Extended output tongue 308 provides a low impedance path between inductor 300 and load 314, despite height restriction 312 dictating that inductor 300 be placed remote from load 314. If inductor 308 did not include extended output tongue 308, current from inductor 300 to load 314 would typically have to flow through a much higher impedance trace of PCB 302. Inductor 300, however, is not limited to use in buck converter or even in DC-to-DC converter applications. For example, some embodiments of inductor 300 could be used in inverter applications.

Figure 6:
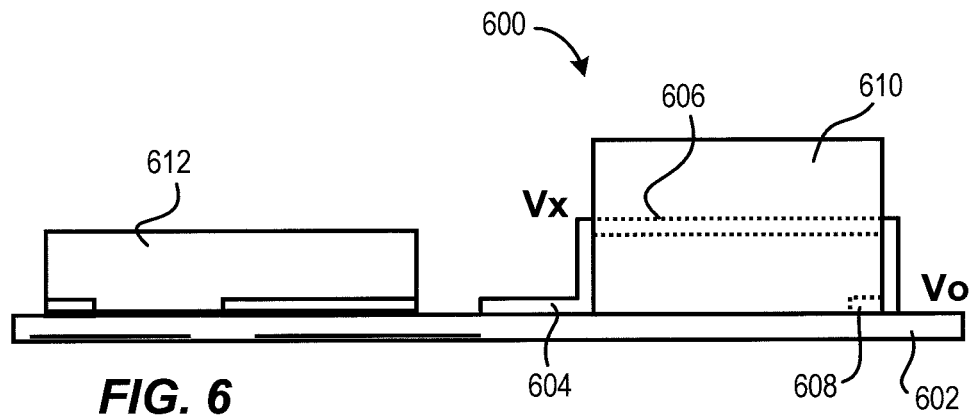
FIG. 6 shows a side plan view of yet another embodiment of the inductor of FIG. 3 installed on a PCB.
Figure 7:
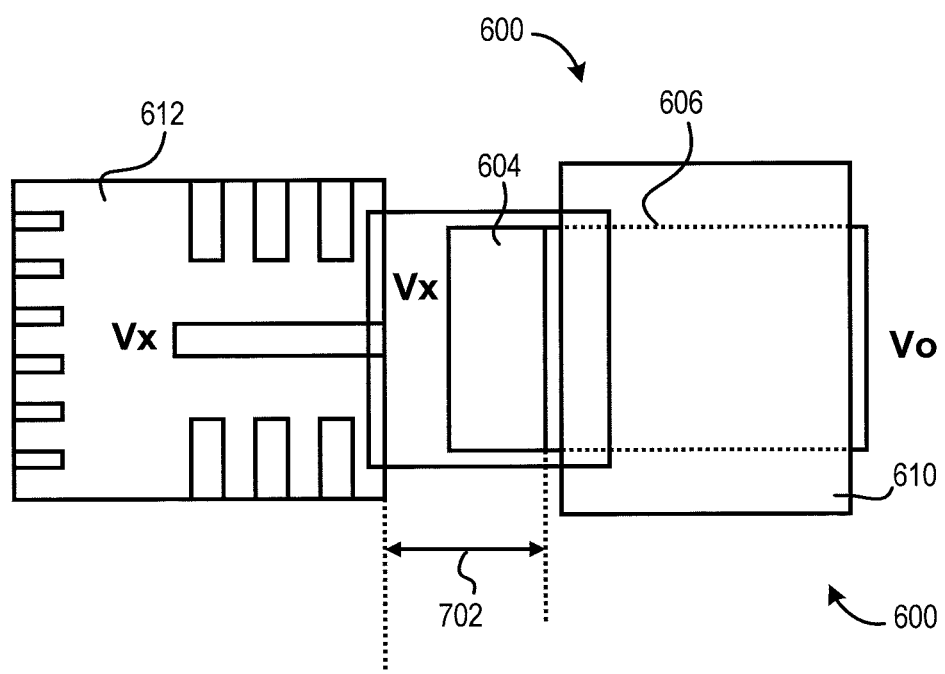
FIG. 7 shows a top plan view of the inductor of FIG. 6.

FIGS. 6 and 7 show one possible application of an embodiment of inductor 300. In particular, FIG. 6 shows a side plan view and FIG. 7 shows a top plan view of one inductor 600, which is an embodiment of inductor 300, installed on a PCB 602. In the examples of FIGS. 6 and 7, inductor 600 serves as a buck converter output inductor. Extended input tongue 604 connects one end of a winding 606 to a DC-to-DC converter switching node Vx, while a solder tab 608 connects the other end of winding 606 to a DC-to-DC converter output node Vo. Winding 606 is wound at least partially around or through at least a portion of a magnetic core 610. Dashed lines indicate the outline of winding 606 where obscured by core 610.

Extended input tongue 604 spans a significant portion of a distance 702 between inductor 600 and a switching device 612, thereby significantly lowering the impedance between switching device 612 and inductor 600. Such lowering of impedance may significantly decrease power loss, as switching node Vx typically conducts a large current magnitude.

As the extended tongues discussed above (e.g., extended output tongue 308 of FIG. 3, extended input tongue 502 of FIG. 5) may significantly improve electrical and thermal conductivity from switching devices (e.g., power semiconductors) towards the load in DC-to-DC converter applications, the concept of paralleling a thick foil with thin PCB traces can also be applied to ground return currents (i.e., currents from the load back to the DC-to-DC converter). An issue with applying naked foils to PCB traces is that such foils can be difficult to handle.

One or more ground return conductors can be attached to an inductor to improve ground return conductivity in the inductor's vicinity. The ground return conductors, for example, are configured and arranged such that their inductance is not significantly increased by presence of the inductor's core, while inductance of the inductor's winding (or windings) is significantly increased by presence of the inductor's core, relative to an otherwise identical inductor without the core. As an example, the ground return conductors may be configured and arranged such that the inductor's core does not form a magnetic path loop around the ground return conductors. In such embodiments, the ground return conductors are external to core, and the ground return conductors may have an inductance similar to that of a PCB ground plane extending under a standard surface mount inductor (without ground return conductors), where the ground plane is in close proximity to the standard surface mount inductor's core.

In many applications, current flows from switching devices through the inductor and to a load. Return current typically flows from the load, through PCB conductive layers under the inductor, and back to the switching devices. Accordingly, use of an inductor including ground return conductors may reduce ground return path impedance while maintaining the PCB's general current flow path.

Additionally, attaching a ground return conductor to an inductor allows both the inductor and the ground return conductor to be placed in a single step, thereby eliminating multiple placement operations required for placement of a discrete inductor and a discrete conductor. Furthermore, applying a foil conductor to a PCB may be difficult due to the foil's flexibility, but attaching a foil ground return conductor to an inductor increases the conductor's rigidity and may thereby facilitate the conductor's placement on a PCB.

Figure 8:
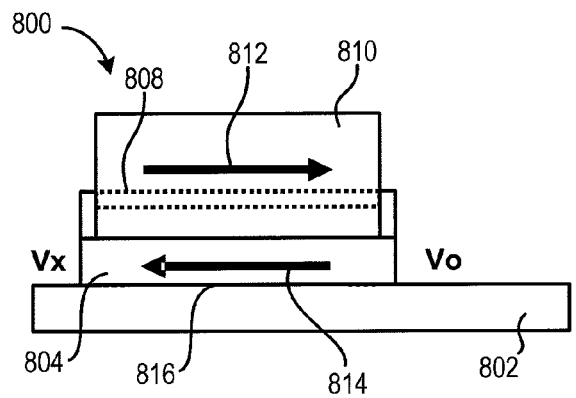
FIG. 8 shows a side plan view of one inductor including ground return conductors installed on a PCB, according to an embodiment.
Figure 10:
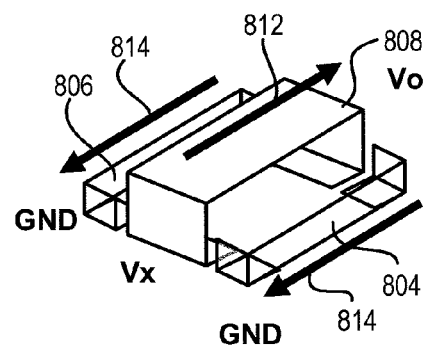
FIG. 10 shows a top perspective view of the inductor of FIGS. 8 and 9 with a magnetic core removed.
Figure 9:
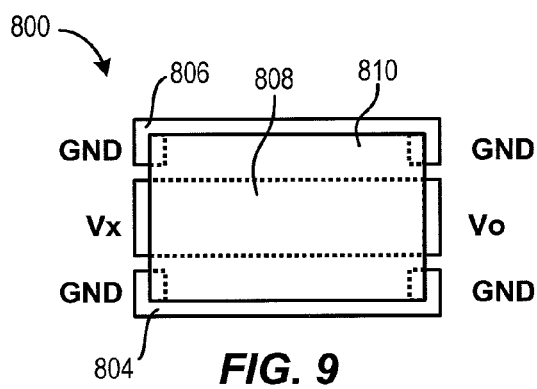
FIG. 9 shows a top plan view of the inductor of FIG. 8.
Figure 11:
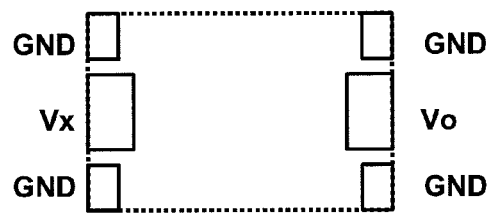
FIG. 11 shows a top plan view of one PCB footprint for use with the inductor of FIGS. 8-10, according to an embodiment.

For example, FIG. 8 shows a side plan view of one inductor 800 installed on a PCB 802, and FIG. 9 shows a top plan view of inductor 800. Inductor 800 includes ground return conductors 804, 806, in addition to a winding 808 wound at least partially around or through at least a portion of a magnetic core 810. Dashed lines indicate the outline of winding 808 and ground return conductors 804, 806 where obscured by core 810 in FIGS. 8 and 9. Core 810 does not form a magnetic path loop around ground return conductors 804, 806. Accordingly, inductance of ground return conductors 804, 806 is not significantly increased by the presence of core 810, and ground return conductors 804, 806 have a lower inductance than winding 808. FIG. 10 shows a top perspective view of inductor 800 with core 810 removed, and FIG. 11 shows a top plan view of one possible PCB footprint for use with inductor 800.

In some embodiments, each end of ground return conductors 804, 806 and each end of winding 808 form respective solder tabs at a same height relative to a bottom surface 816 of core 810 to facilitate surface mount connection of inductor 800 to a PCB. Ground return conductors 804, 806, for example, have a thickness similar to that of winding 808 and are significantly thicker than foil typically forming a PCB ground return plane. Accordingly, ground return conductors 804, 806 may be used to supplement (or replace) a ground return conductor in a PCB (e.g., a PCB 802), and thereby significantly reduce the ground return impedance in the vicinity of inductor 800. Since ground-return conductors 804, 806 are attached to core 810, and thus to inductor 800, they are easier to handle than discrete conductors and may be positioned by pick-and-place equipment simultaneously with positioning inductor 800.

Accordingly, inductor 800 may be used to provide a low impedance, two-way path for current between DC-to-DC converter (e.g., buck converter) switching devices and a load, as shown in the examples of FIG. 8-11. In particular winding 808 may carry current from a switching node Vx to an output node Vo, as shown by arrows 812. Ground return conductors 804, 806 may in turn carry at least part of the ground return from the load back to the switching devices, as shown by arrows 814.

The configuration and quantity of ground return conductors 804, 806 may be varied, and examples of some variations are discussed below. Additionally, although inductor 800 is discussed in the context of winding 808 carrying current to a load and ground return conductors 804, 806 carrying ground return current, inductor 800 could be used in other manners. For example, one or more of ground return conductors 804, 806 could be utilized to carry current, such as current from a memory-keep alive power supply (not shown) to the load, instead of ground return current. Furthermore, inductor 800 is not limited to use in DC-to-DC converter applications. For example, some embodiments of inductor 800 could be used in inverter applications.

Figure 12:
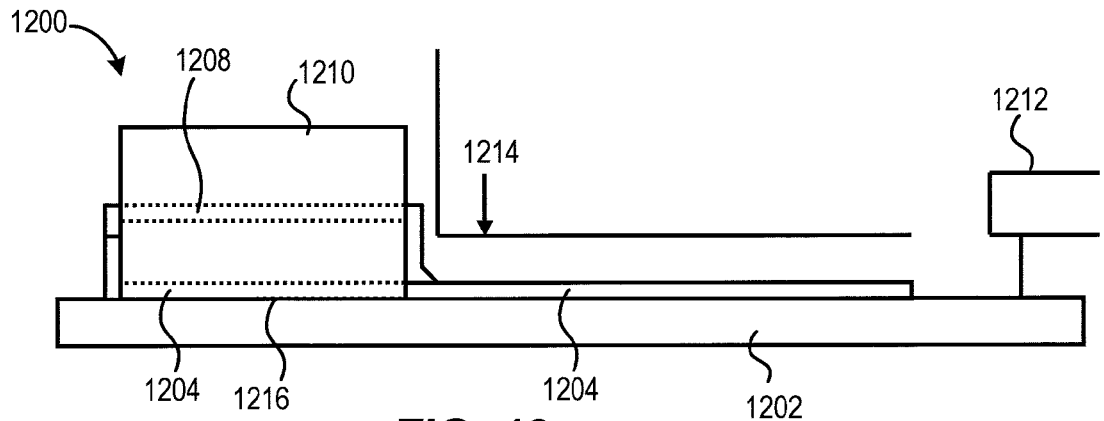
FIG. 12 is a side plan view of another embodiment of the inductor of FIG. 8 installed on a PCB.
Figure 13:
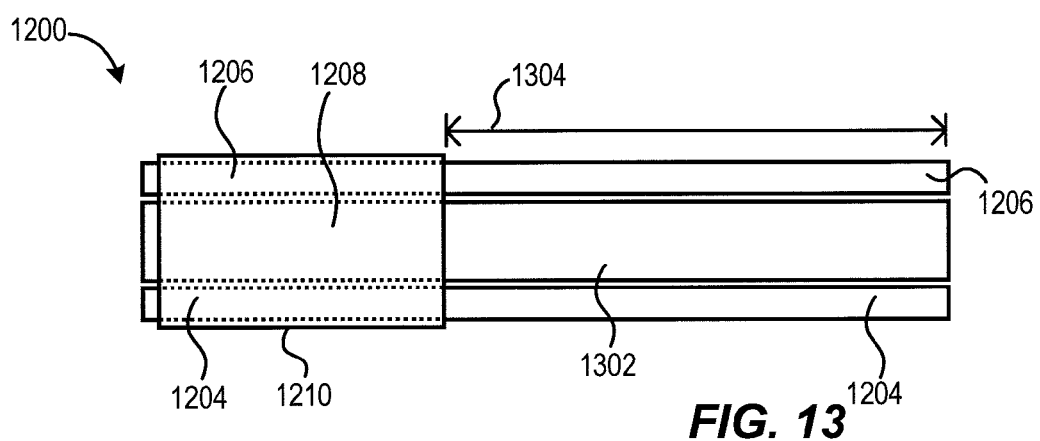
FIG. 13 is a top plan view of the inductor of FIG. 12.
Figure 14:
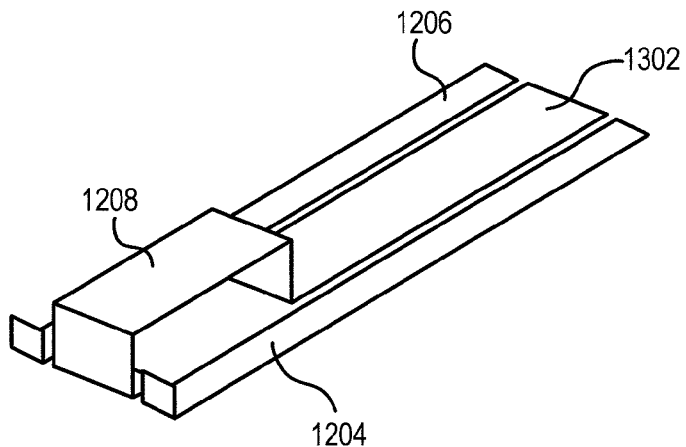
FIG. 14 is a top perspective view of the inductor of FIGS. 12 and 13 with a magnetic core removed.

A variation of inductor 800 is shown in FIGS. 12-14. FIG. 12 is a side plan view of one inductor 1200 installed on a PCB 1202, and FIG. 13 is a top plan view of inductor 1200. Inductor 1200 is similar to inductor 300 of FIG. 3; however, inductor 1200 includes ground return conductors 1204, 1206 in addition to a winding 1208 at least partially wound around or through at least a portion of a magnetic core 1210. Dashed lines indicate the outline of winding 1208 and ground return conductors 1204, 1206 where obscured by core 1210. Ground return conductors 1204, 1206 attach to a bottom surface 1216 of core 1210, and core 1210 does not form a magnetic path loop around ground return conductors 1204, 1206. Accordingly, inductance of ground return conductors 1204, 1206 is not significantly increased by presence of core 1210. An extended output tongue 1302 is electrically coupled to winding 1208, and ground return conductors 1204, 1206, for example, extend at least partially along a length 1304 of extended output tongue 1302. FIG. 14 shows a top perspective view of inductor 1200 with core 1210 removed. Portions of ground conductors 1204, 1206 are, for example, formed at the same height as extended output tongue 1302 with respect to bottom surface 1216 of core 1210 to facilitate surface mount connection of inductor 1200 to a PCB. FIG. 12 shows one possible application of inductor 1200 where extended output tongue 1302 and ground return conductors 1204, 1206 provide a two way, low impedance path between inductor 1200 and a load 1212 despite a height restriction 1214 dictating that inductor 1200 be placed remote from load 1212.

Figure 15:
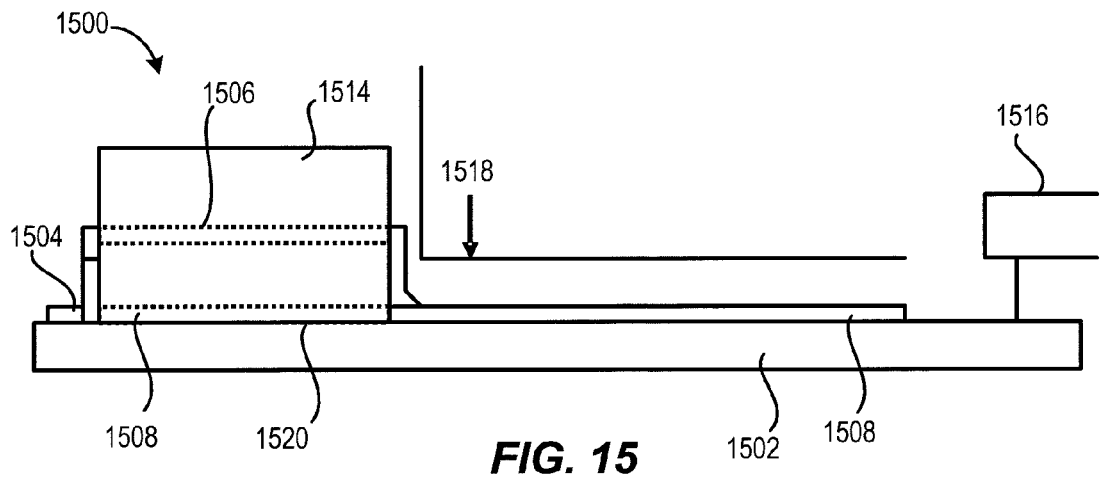
FIG. 15 shows a side plan view of yet another embodiment of the inductor of FIG. 8 installed on a PCB.
Figure 16:
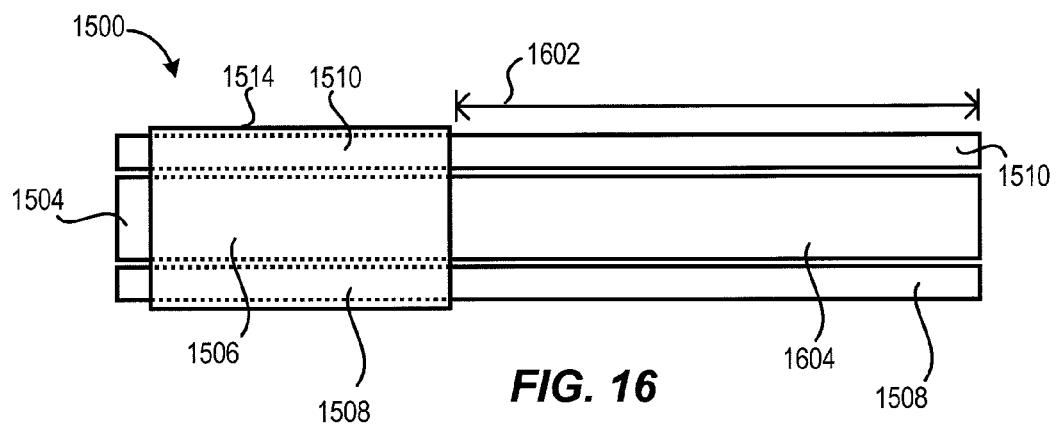
FIG. 16 shows a top plan view of the inductor of FIG. 15.
Figure 17:
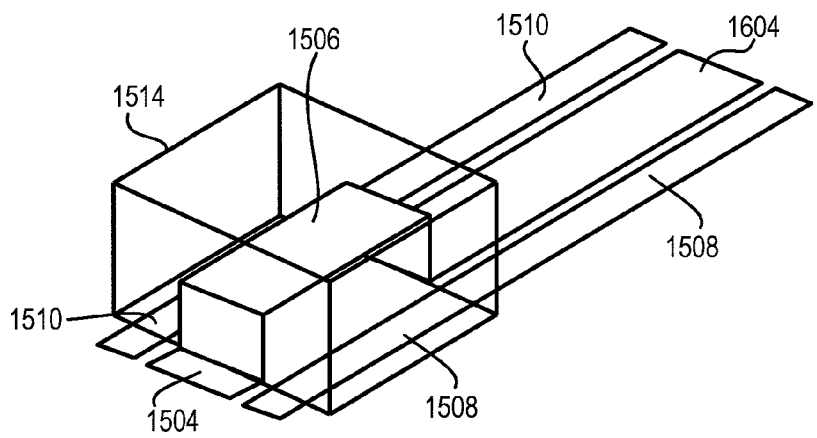
FIG. 17 shows a top perspective view of inductor of FIGS. 15 and 16.

FIGS. 15-17 show another variation of inductor 800. In particular, FIG. 15 shows a side plan view of one inductor 1500 installed on a PCB 1502. FIG. 16 shows a top plan view, and FIG. 17 shows a top perspective view of inductor 1500. Inductor 1500 is similar to inductor 1200 (FIGS. 12-14), but inductor 1500 includes an extended input tongue 1504 electrically coupled to a winding 1506. Ground return conductors 1508, 1510 extend at least partially along a length 1602 of an extended output tongue 1604. Winding 1506 is wound at least partially around or through at least a portion of a magnetic core 1514. Dashed lines indicate the outline of winding 1506 and ground return conductors 1508, 1510 where obscured by core 1514 in the plan views of FIGS. 15 and 16. Core 1514 is shown as being transparent in FIG. 17. Extended output tongue 1604, extended input tongue 1504, and the portions of ground return conductors 1508, 1510 extending along extended output tongue 1604 are, for example, formed at the same height relative to a bottom surface 1520 of core 1514 to facilitate surface mount connection of inductor 1500 to a PCB. Inductor 1500 is, for example, used to provide a two way, low impedance path between DC-to-DC converter switching devices and inductor 1500, as well as between inductor 1500 and a load 1516 separated from inductor 1500 by a height restriction 1518.

Figure 18:
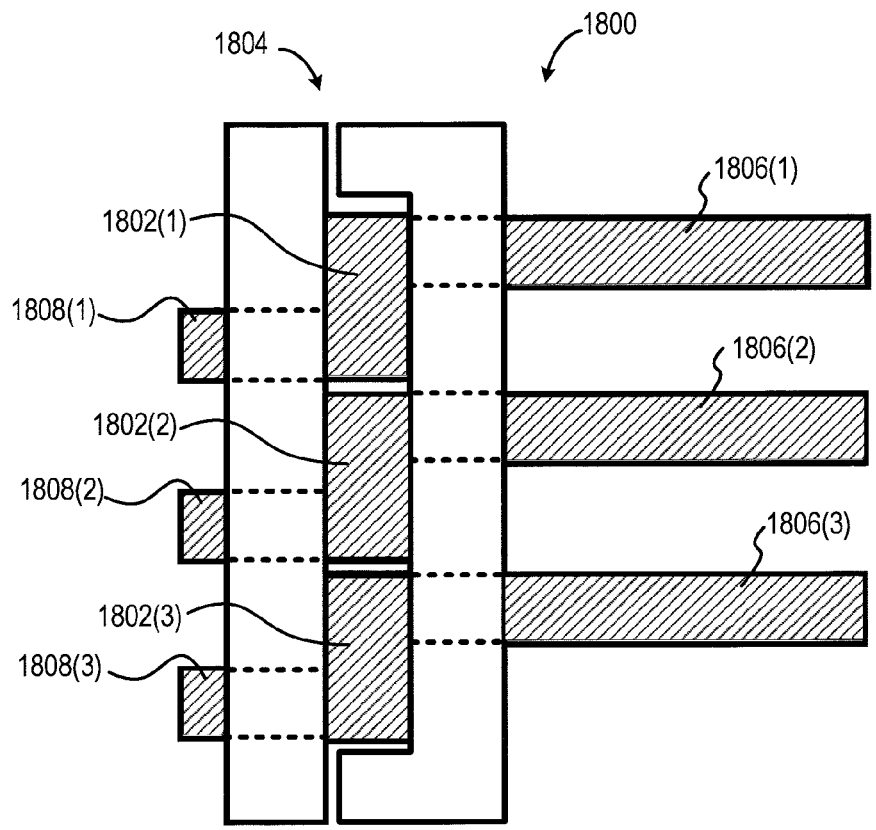
FIG. 18 shows a top plan view one coupled inductor including extended output tongues, according to an embodiment.
Figure 19:
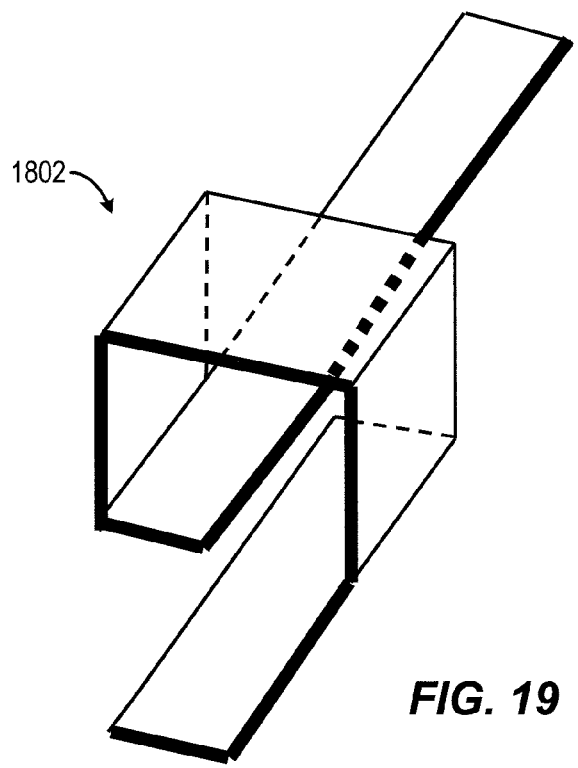
FIG. 19 shows a top perspective view of one winding of the inductor of FIG. 18.

Some embodiments of inductors with an extended tongue (e.g., inductor 300, FIG. 3) and inductors with ground return conductors (e.g., inductor 800, FIG. 8) are multiple winding inductors with N windings, where N is an integer greater than one. For example, FIG. 18 shows a top plan view of one coupled inductor 1800, which includes three windings 1802 which are magnetically coupled together by a magnetic core 1804. Dashed lines indicate the outline of windings 1802 where obscured by core 1804. A respective extended output tongue 1806 is electrically coupled to one end of each winding 1802, and a respective extended input tongue 1808 is electrically coupled to the other end of each winding 1802. Each extended output tongue 1806 and each extended input tongue 1808 is, for example, an extension of a respective winding 1802. FIG. 19 shows a top perspective view of one winding 1802.

Figure 20:
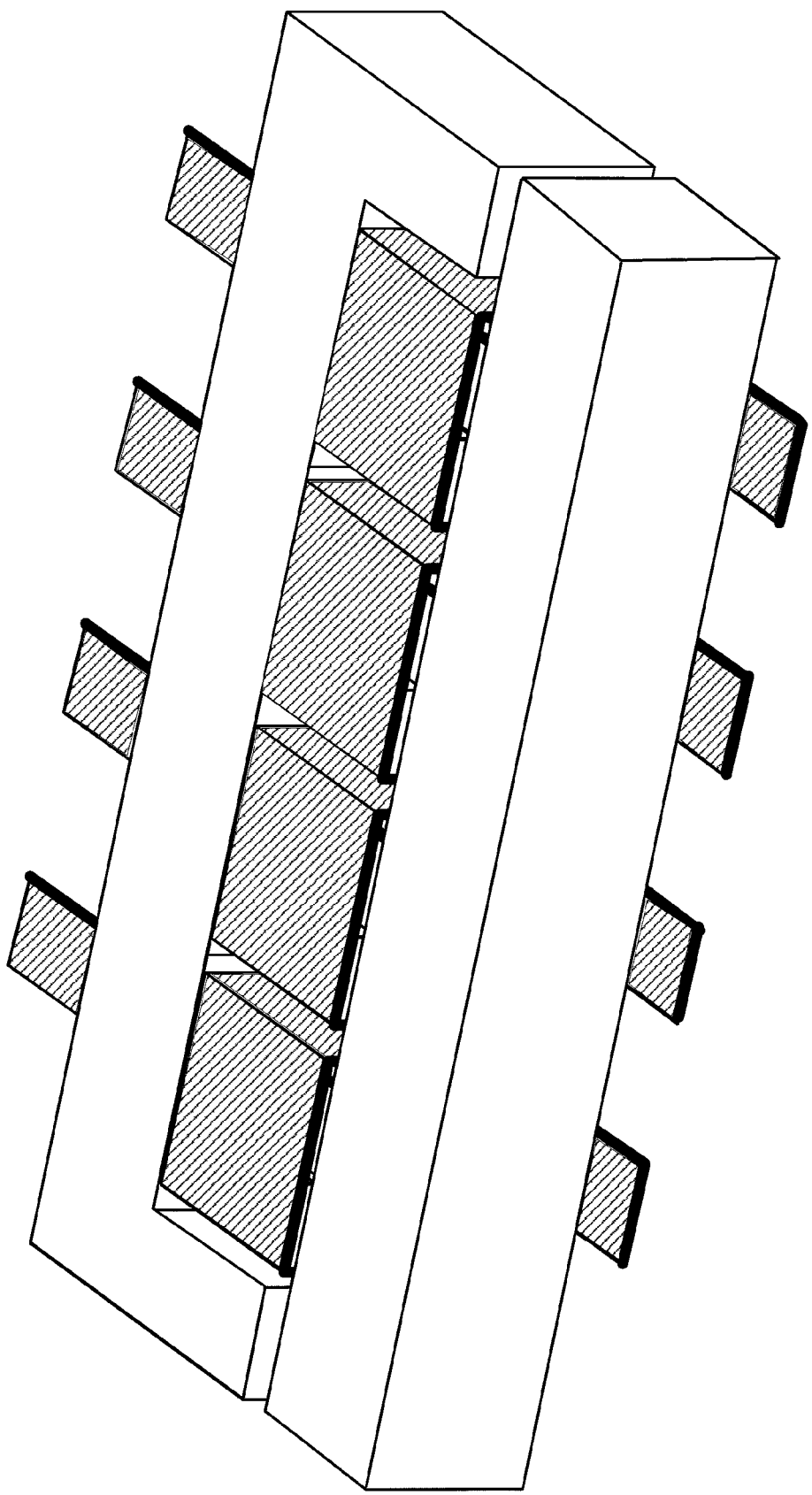
FIG. 20 shows a top perspective view of another embodiment of the inductor of FIG. 18.

At least portions of extended output tongues 1806 and extended input tongues 1808 are, for example, formed at a same height relative to a bottom surface of core 1804 to facilitate surface mount connection of inductor 1800 to a PCB. Each extended output tongue 1806, for example, supplements or replaces a PCB trace connecting inductor 1800 to a load (e.g., a processor). Each extended input tongue 1808, for example, supplements or replaces a PCB trace connecting inductor 1800 to DC-to-DC converter switching devices. Although FIG. 18 shows inductor 1800 as including three windings, inductor 1800 could have any number of windings greater than one. For example, FIG. 20 shows a top perspective view of a four winding embodiment of inductor 1800.

In some systems, each winding of a multiple winding inductor (e.g., inductor 1800) may be part of a separate phase of a multiphase DC-to-DC converter, such as discussed above with respect to FIG. 2.

Figure 21:
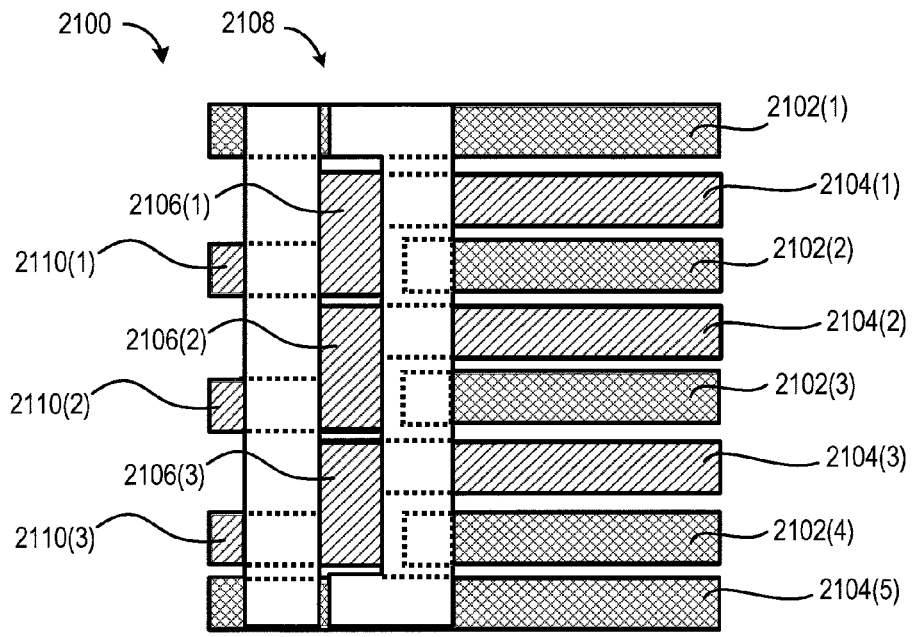
FIG. 21 shows a top plan view of one coupled inductor including ground return conductors and extended input and output tongues, according to an embodiment.

FIG. 21 shows a top plan view of one coupled inductor 2100, which is similar to inductor 1800 (FIG. 18); however, inductor 2100 includes ground return conductors 2102 disposed along extended output tongues 2104, where each extended output tongue 2104 is electrically coupled to a respective winding 2106. Ground return conductors 2102, for example, provide a low impedance ground return path between inductor 2100 and another component (e.g., a load, such as a processor). Ground return conductors 2102 as well as extended output tongues 2104 also may serve as heat sinks to cool a PCB that inductor 2100 is installed on. Dashed lines in FIG. 21 indicate outlines of windings 2106 and ground return conductors 2102 obscured by a magnetic core 2108 of inductor 2100. At least respective portions of ground return conductors 2102, extended output tongues 2104, and extended input tongues 2110 are, for example, formed at a same height relative to a bottom surface of inductor 2100 to facilitate surface mount connection to a PCB.

Figure 22:
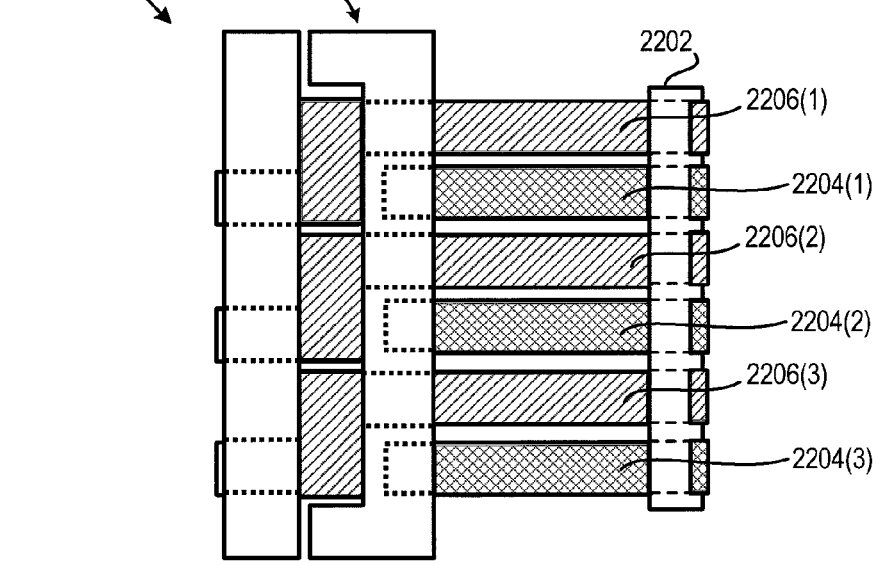
FIG. 22 shows a top plan view of an embodiment of the coupled inductor of FIG. 21 including an isolator.
Figure 23:
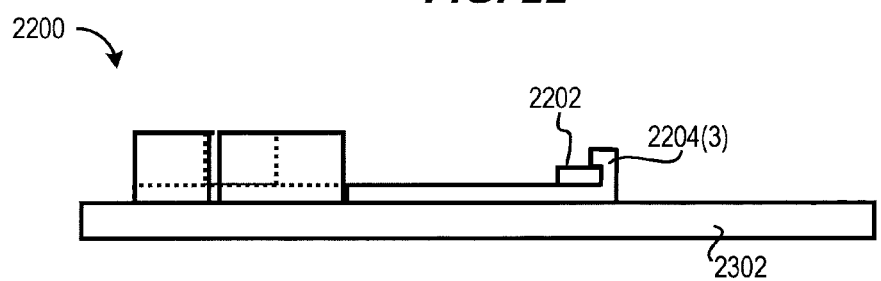
FIG. 23 shows a side plan view of the inductor of FIG. 22.

It should be noted that the quantity of windings as well as the quantity and configuration of ground return conductors may be varied. For example, FIG. 22 is a top plan view and FIG. 23 is a side plan view of one coupled inductor 2200, which is an embodiment of coupled inductor 2100 including at least one mechanical isolator 2202 connected to at least some of ground return conductors 2204 and/or extended output tongues 2206. Isolator 2202 increases mechanical strength of inductor 2200, as well as the planarity of ground return conductors 2204 and/or extended output tongues 2206. FIG. 23 shows inductor 2200 installed on a PCB 2302. Dashed lines indicate the outlines of windings and ground return conductors 2204 obscured by a magnetic core 2208 or isolator 2202.

Figure 24:
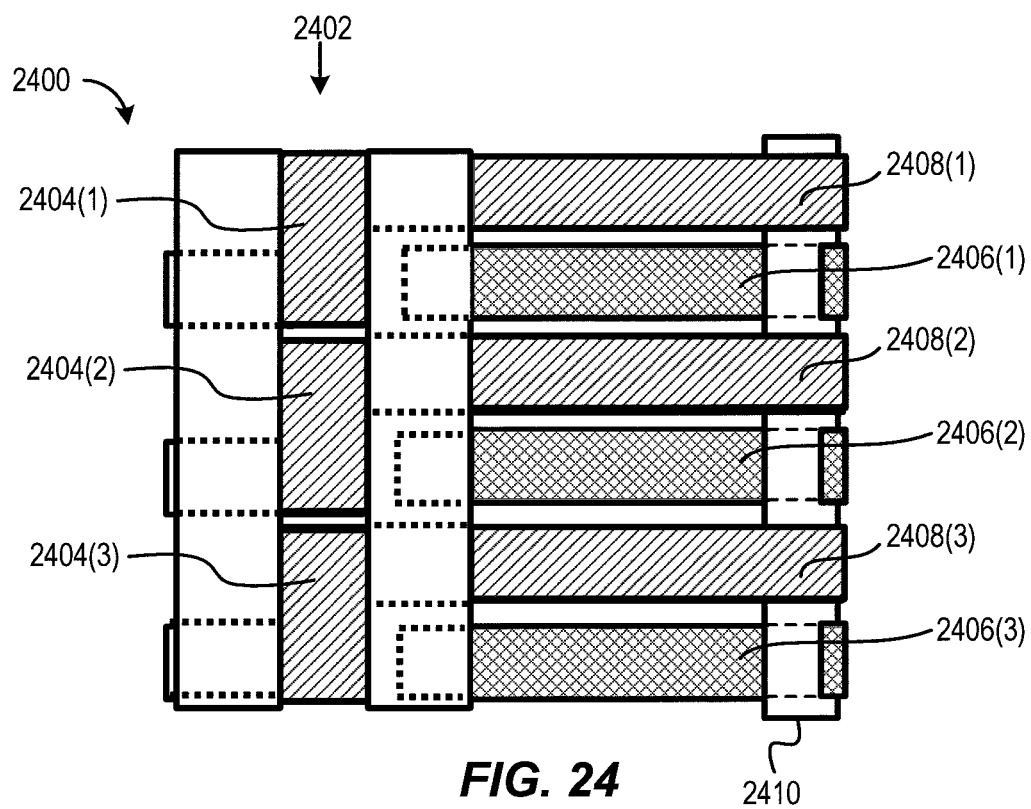
FIG. 24 shows a top plan view of one coupled inductor including ground return conductors and extend output tongues, according to an embodiment.
Figure 25:
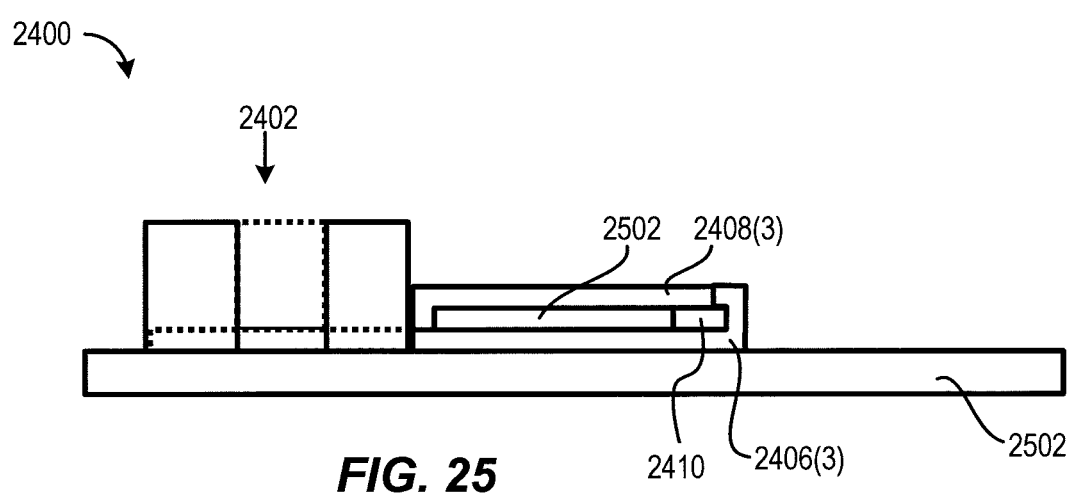
FIG. 25 shows a side plan view of the coupled inductor of FIG. 24 installed on a PCB.
Figure 26:
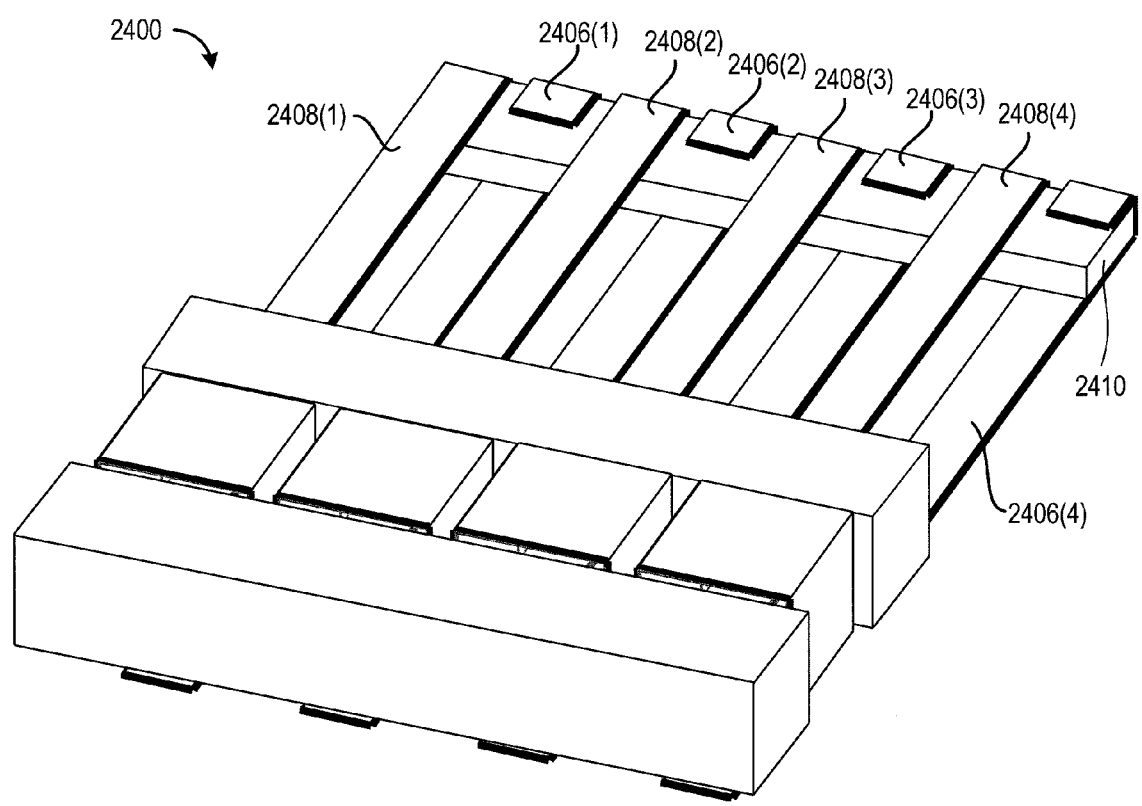
FIG. 26 is a top perspective view of the coupled inductor of FIGS. 24 and 25.

FIG. 24 is a top plan view of one coupled inductor 2400, FIG. 25 is a side plan view of coupled inductor 2400 installed on a PCB 2502, and FIG. 26 is a top perspective view of a four winding embodiment of coupled inductor 2400. Coupled inductor 2400 is similar to coupled inductor 2200 (FIG. 22). However, in contrast with coupled inductor 2200, coupled inductor 2400's magnetic core 2402 does not include features (e.g., gapped outer legs) to boost leakage inductance values. Instead, core 2402 and windings 2404 form a nearly-ideal transformer, and an area or channel 2502 formed by ground return conductors 2406 and extended output tongues 2408 serves as an "air core inductor" which boosts the leakage inductance values of windings 2404. The air core advantageously has close to zero core losses. Isolator 2410 can optionally be formed of a magnetic material (e.g., a ferrite and/or a powdered iron material) to increase the leakage inductance values of inductor 2400. Such magnetic material could be selected such that isolator 2410 at least partially saturates during normal operation of inductor 2400, thereby resulting in a significant decrease in leakage inductance values at high but normal winding currents. Dashed lines indicate an outline of windings 2404 and ground return conductors 2406 where obscured by core 2402 or isolator 2410.

Figure 27:
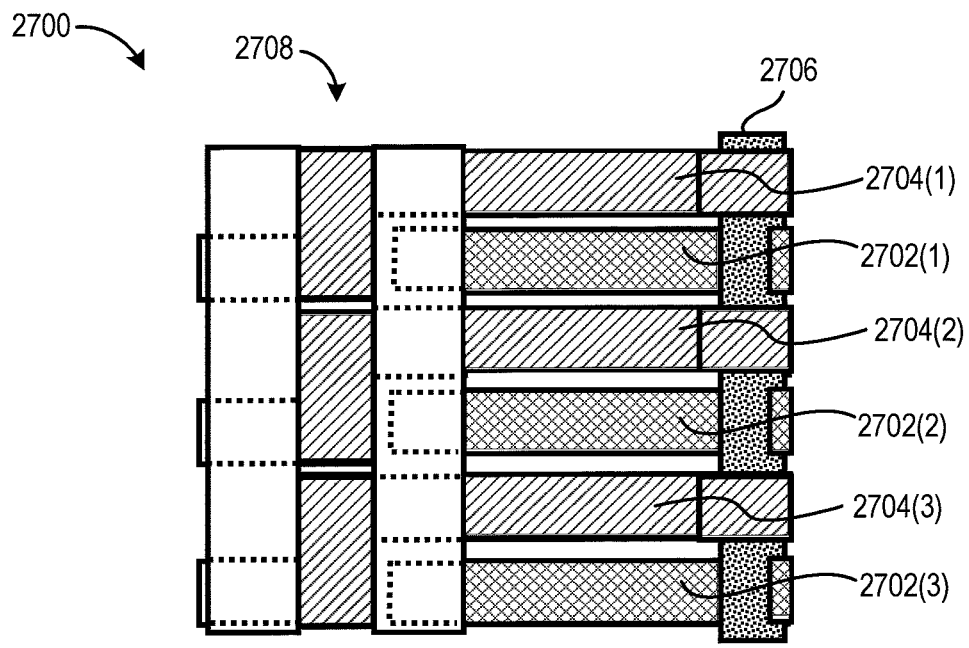
FIG. 27 shows a top plan view of one coupled inductor including ground return conductors and extended output tongues, according to an embodiment.
Figure 28:
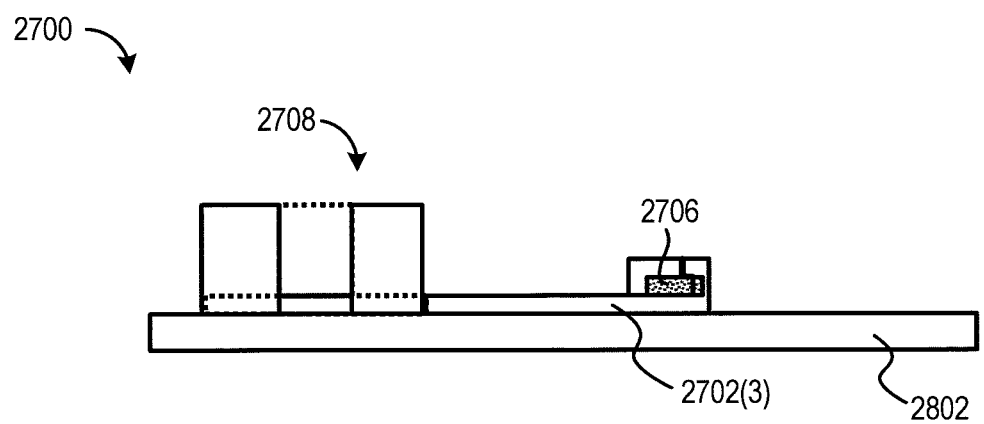
FIG. 28 shows a side plan view of the coupled inductor of FIG. 27 installed on a PCB.

FIG. 27 shows a top plan view of one coupled inductor 2700, and FIG. 28 shows a side plan view of coupled inductor 2700 installed on a PCB 2802. Coupled inductor 2700 is similar to inductor 2400 (FIG. 24). However, in inductor 2700, ground return conductors 2702 and extended output tongues 2704 are formed at least substantially at the same height with respect to magnetic core 2708 and do not form air core inductors. Isolator 2706 is formed of a magnetic material, which may be selected such that isolator 2706 at least partially saturates during normal operation of inductor 2700, thereby resulting in a significant decrease in leakage inductance values at high but normal winding currents. Dashed lines indicate the outline of windings and ground return conductors 2702 obscured by magnetic core 2708.

In other embodiments, low profile inductors as illustrated in FIG. 29-32, 33-35, or 36-38 have a low resistance foil winding, which is for example in part used to bridge the distance from a height-unrestricted area of a PCB to a load.

Figure 29:
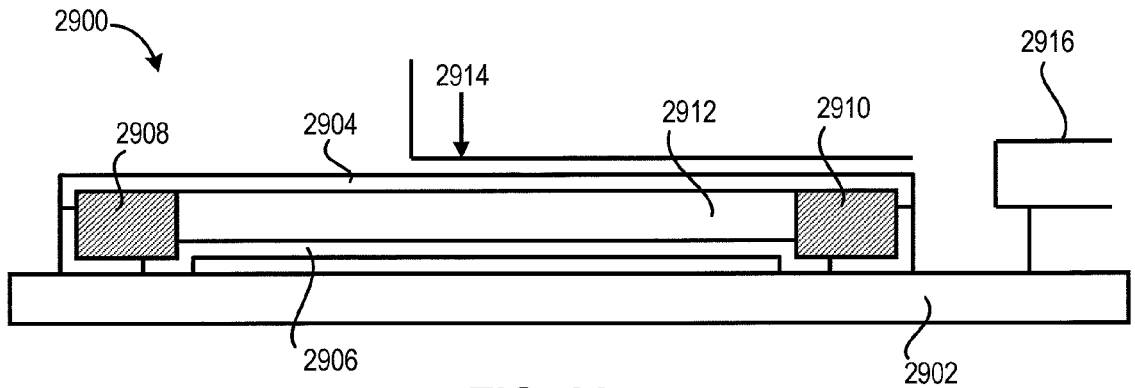
FIG. 29 shows a side plan view of one inductor having a low profile installed on a PCB, according to an embodiment.
Figure 30:
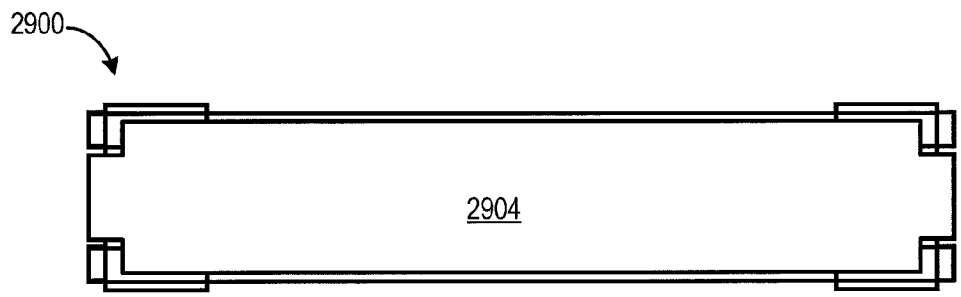
FIG. 30 shows a top plan view of the inductor of FIG. 29.
Figure 31:
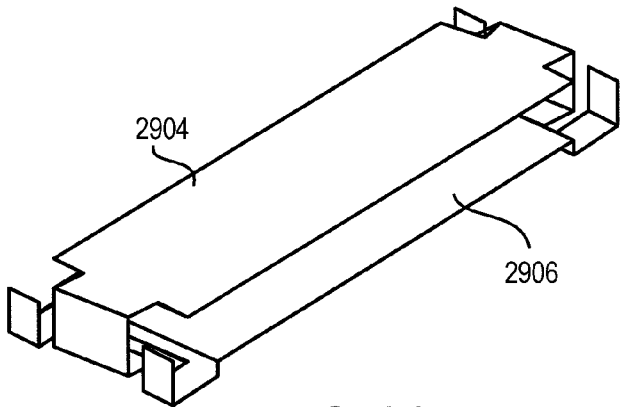
FIG. 31 shows a top perspective view of the inductor of FIGS. 29 and 30 with isolators removed.
Figure 32:
FIG. 32 shows one PCB footprint for use with the inductor of FIGS. 29-31, according to an embodiment.

FIG. 29 shows a side plan view of one inductor 2900 having a low profile installed on a PCB 2902, and FIG. 30 shows a top plan view of inductor 2900. Inductor 2900 includes an elongated foil winding 2904 disposed above an elongated foil ground return conductor 2906. Ground return conductor 2906 is, for example, configured such that it only partially contacts a PCB, as shown in FIG. 29. Isolators 2908, 2910 separate winding 2904 and ground return conductor 2906 such that inductor 2900 forms an area or channel 2912 that serves as an air core. Winding 2904 and ground return conductor 2906 are, for example, at least substantially parallel along channel 2912. One or more of isolators 2908, 2910 may optionally include a magnetic material (e.g., a ferrite material and/or a powdered iron material) to boost inductance of inductor 2900. FIG. 31 is a top perspective view of inductor 2900 with isolators 2908, 2910 removed, and FIG. 32 is a top plan view of one PCB footprint that could be used with inductor 2900. As shown in FIG. 29, one possible application of inductor 2900 is to bridge a height restriction 2914 in the vicinity of a load 2916.

Figure 33:
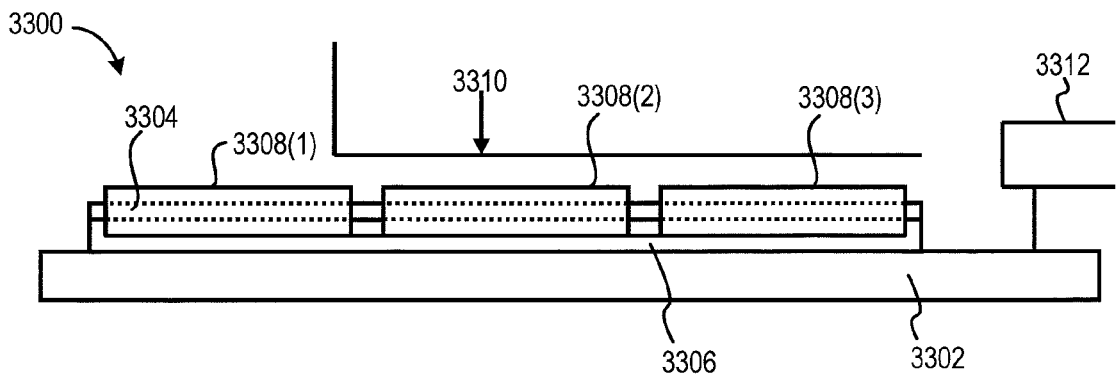
FIG. 33 shows a side plan view of one inductor having a low profile installed on a PCB, according to an embodiment.
Figure 34:
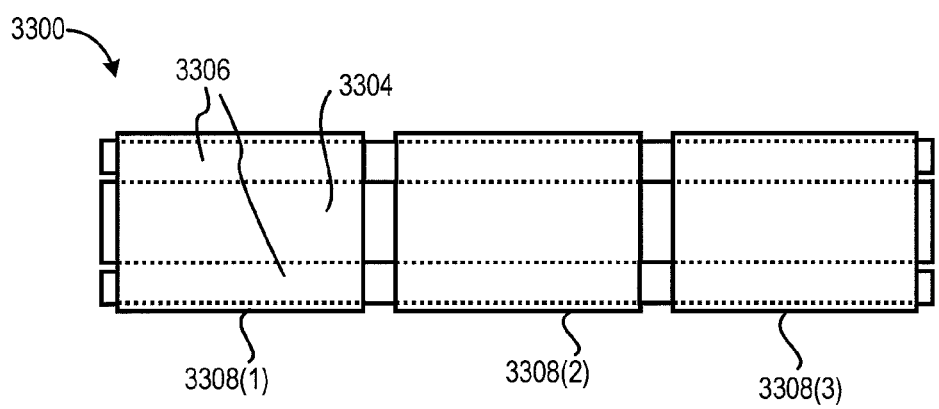
FIG. 34 shows a top plan view of the inductor of FIG. 33.
Figure 35:
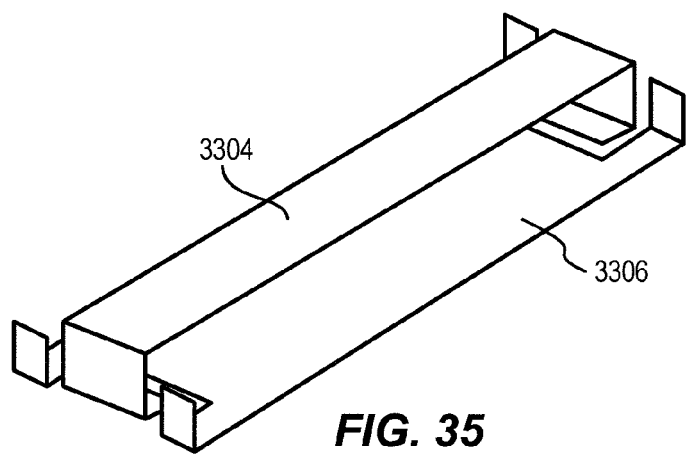
FIG. 35 shows a top perspective view of the inductor of FIGS. 33 and 34 with magnetic sections removed.

FIG. 33 shows a side plan view of one inductor 3300 having a low profile installed on a PCB 3302, and FIG. 34 shows a top plan view of inductor 3300. Inductor 3300 includes a foil winding 3304 disposed above a foil ground return conductor 3306. Inductor 3300 includes at least one magnetic section 3308 formed of a magnetic material (e.g., a ferrite material and/or a powdered iron material) disposed on ground return conductor 3306. Winding 3304 extends through an opening in each magnetic section 3308. Magnetic sections 3308 increase inductance of inductor 3300, provide mechanical support, and cause inductor 3300 to be "shielded". It may be advantageous for inductor 3300 to include a number of smaller magnetic sections 3308 instead of one large magnetic section because smaller magnetic sections may facilitate manufacturability, resist cracking, and tolerate PCB flexing, while nevertheless providing significant collective core cross section, which helps minimize core loss in switching power supply applications. Winding 3304 and ground return conductor 3306 are shown by dashed lines where obscured by magnetic sections 3308 in FIGS. 33-34. FIG. 35 shows a top perspective view of inductor 3300 with magnetic sections 3308 removed. As shown in FIG. 33, one possible application of inductor 3300 is to bridge a height restriction 3310 in the vicinity of a load 3312.

Figure 36:
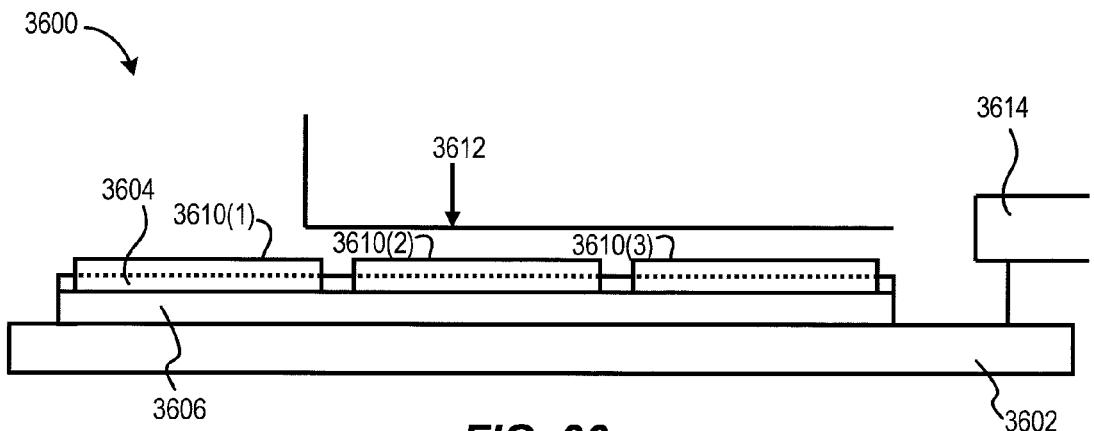
FIG. 36 shows a side plan view of one inductor having a low profile installed on a PCB, according to an embodiment.
Figure 37:
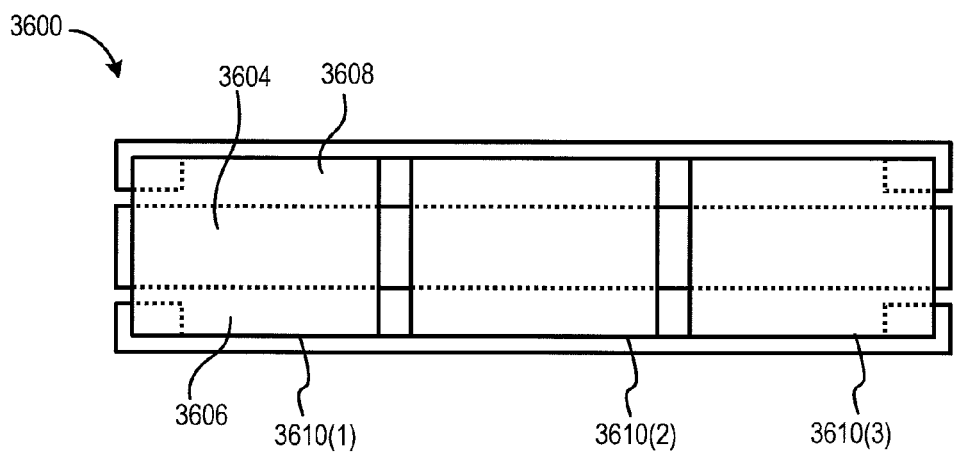
FIG. 37 shows a top plan view of the inductor of FIG. 36.
Figure 38:
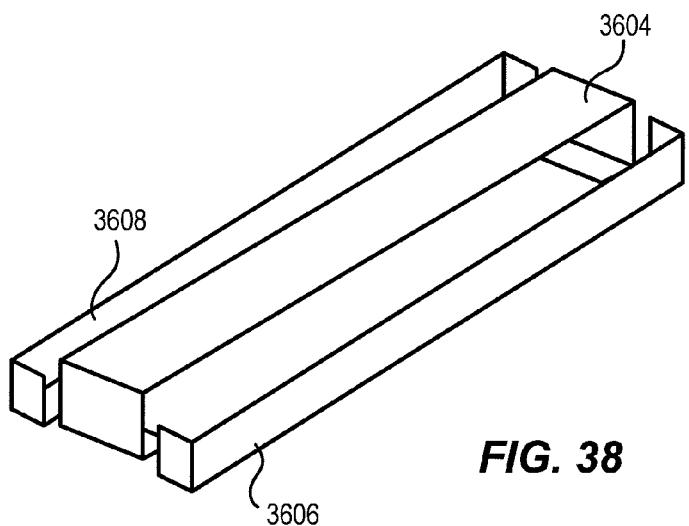
FIG. 38 shows a top perspective view of the inductor of FIGS. 36 and 37 with magnetic sections removed.

FIG. 36 shows a side plan view of one low profile inductor 3600 installed on a PCB 3602, and FIG. 37 shows a top plan view of inductor 3600. Inductor 3600 includes a foil winding 3604 disposed between ground return conductors 3606, 3608. At least one magnetic section 3610 (e.g., formed of a ferrite material and/or a powdered iron material) is disposed between ground return conductors 3606, 3608. Winding 3604 is wound through an opening in each magnetic section 3610 in FIGS. 36-37. For the same reasons as discussed above with respect to inductor 3300 (FIGS. 33-35), it may be advantageous for inductor 3600 to include a number of smaller magnetic sections 3610 instead of one large magnetic section. The outlines of winding 3604 and ground return conductors 3606, 3608 are shown by dashed lines where obscured by magnetic sections 3610. FIG. 38 shows a top perspective view of inductor 3600 with magnetic sections 3610 removed. Inductor 3600 may allow for use of larger cross section magnetic sections than inductor 3300 due to ground return conductors 3606, 3608 being disposed only on the sides of inductor 3600, which allows magnetic sections 3610 to occupy the portion of inductor 3600's height that would otherwise be occupied by ground return conductors. As shown in FIG. 36, one possible application of inductor 3600 is to bridge a height restriction 3612 in the vicinity of a load 3614.

State of the art switching devices generally have a height of less than one millimeter when assembled on a PCB. Other commonly used surface mount components, such as ceramic capacitors, also have a similarly low height. Inductors, however, typically have a height of several millimeters so that their cores have a sufficiently large cross section to keep core losses to an acceptable level.

Figure 39:
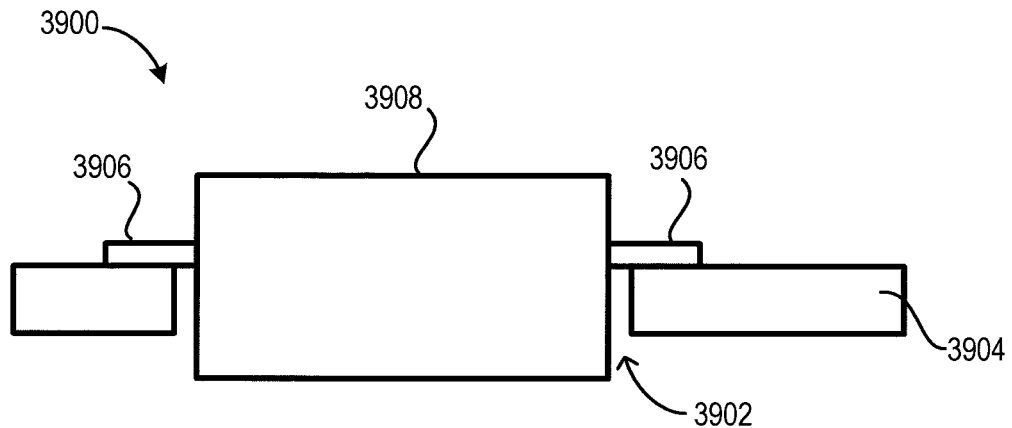
FIG. 39 shows a side cross-sectional view of a PRIOR ART drop-in inductors installed in a PCB aperture.

Accordingly, in height restricted applications, it may be desirable to use a "drop-in" inductor disposed in a PCB aperture. For example, FIG. 39 shows a side cross-sectional view of a prior art drop-inductor 3900 installed in an aperture 3902 of a PCB 3904. Inductor 3900 includes solder tabs 3906, a magnetic core 3908, and a soft, multi-turn wire winding (not shown in FIG. 39) wound around core 3908 and connected to solder tabs 3906.

Figure 40:
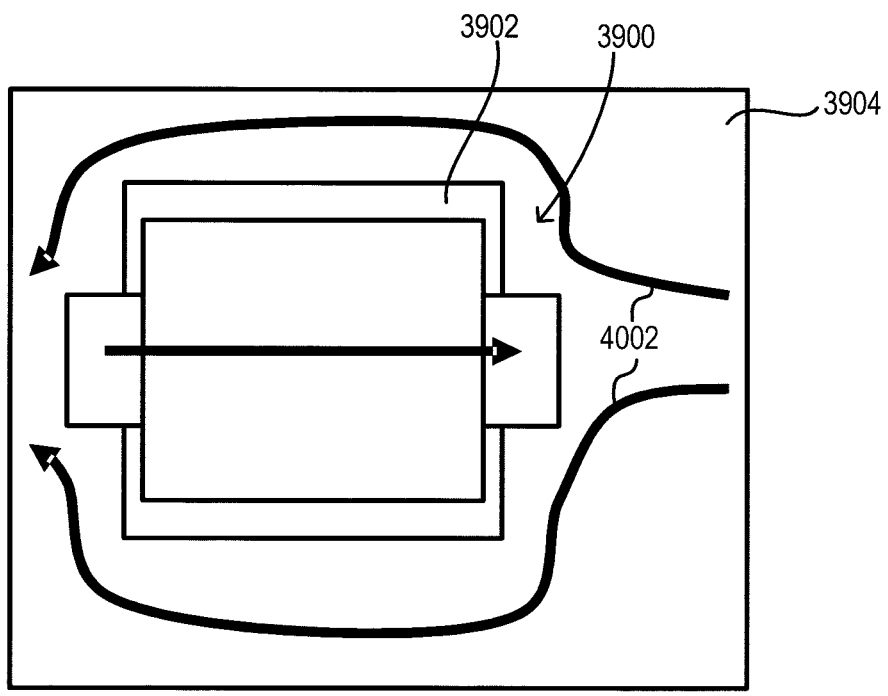
FIG. 40 shows a top plan view of the inductor of FIG. 39 installed in a PCB aperture.
Figure 41:
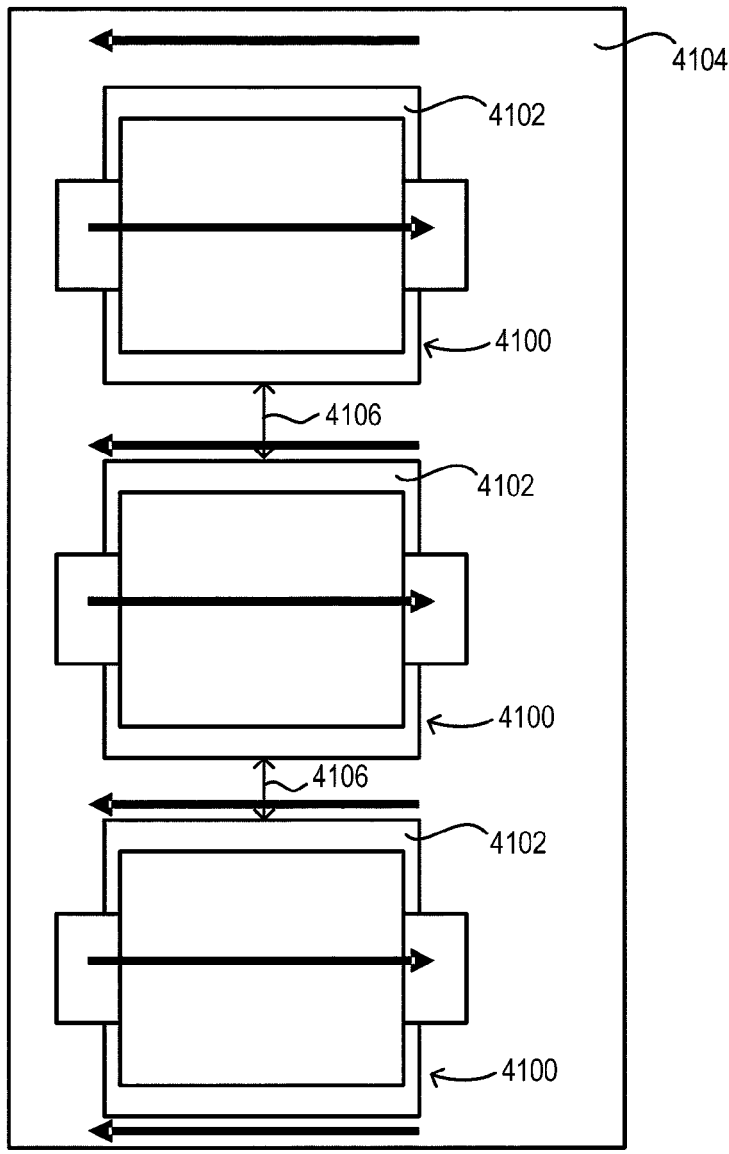
FIG. 41 shows a top plan view of a plurality of PRIOR ART drop-in inductors installed in respective PCB apertures.

Inductor 3900 advantageously utilizes the height on both sides of PCB 3904, as well as the thickness of PCB 3904. However, the aperture required for drop-in inductor 3900 reduces the path for return current through ground plane or interconnect layers of the PCB in the vicinity of the inductor, thereby increasing the return path impedance and associated losses. For example, FIG. 40 shows a top plan view of inductor 4000 installed in aperture 3902 of PCB 3904. Return current cannot flow through aperture 3902—accordingly, return current must flow around aperture 3902, as represented by arrows 4002, which increases return path impedance. Accordingly, with typical drop-in inductors, sufficient space must be provided around aperture 3902 for return current conduction. Additionally, inductance is affected by the return current path, and aperture 3902 will affect the inductance of inductor 3900 because return current does not flow under inductor 3900. The situation may be amplified in multiphase applications, such as shown in FIG. 41, where a plurality of apertures 4102 in a PCB 4104 are required for prior art drop-in inductors 4100. Apertures 4102 significantly increase return path impedance, and significant spacing 4106 between apertures 4102 is required to provide a return current path.

Furthermore, inductor 3900 is often fragile when installed in a PCB aperture. In particular, inductor 3900's solder tabs 3906 typically support inductor 3900's entire weight because inductor 3900's core 3908 typically does not contact PCB 3904. Accordingly, solder tabs 3906 are typically subject to significant mechanical stress, and may cause core 3908, which is typically formed of a relatively fragile magnetic material, to crack.

Figure 42:
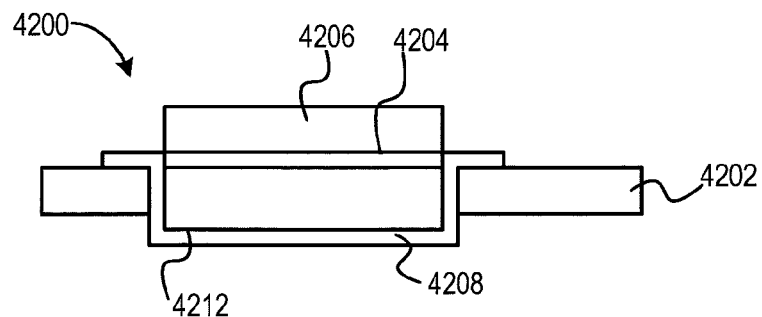
FIG. 42 shows a side cross-sectional view of one drop-in inductor including ground return conductors installed in a PCB aperture, according to an embodiment.
Figure 43:
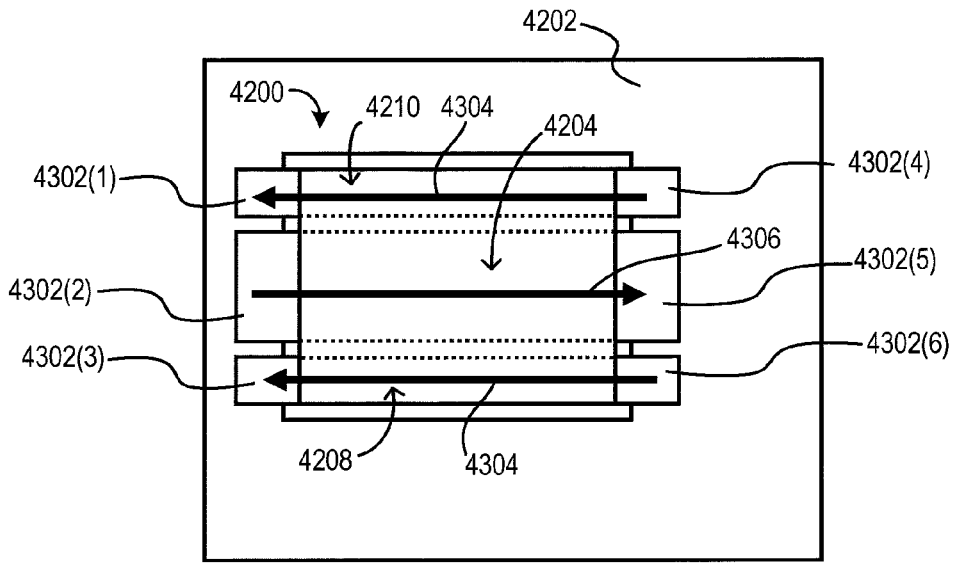
FIG. 43 shows a top plan view of the inductor of FIG. 42 installed in a PCB aperture.
Figure 44:
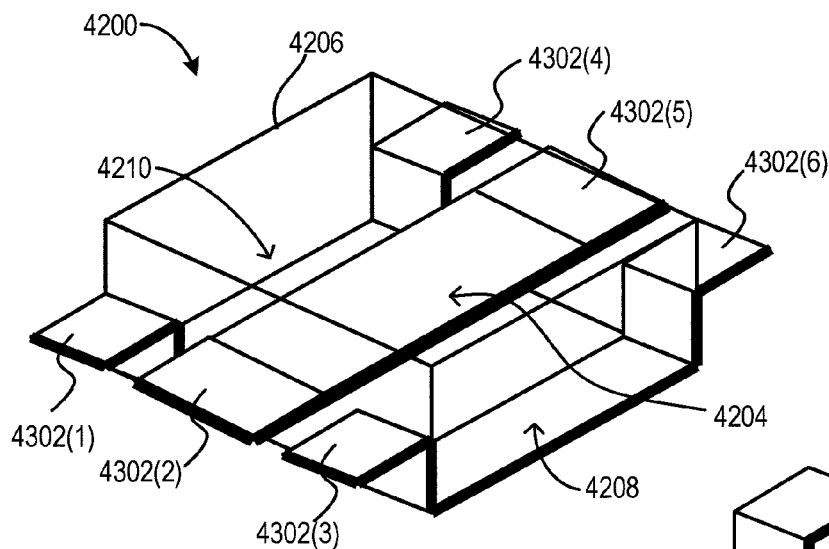
FIG. 44 shows a top perspective view of the inductor of FIGS. 42 and 43.

At least some of the problems discussed above can be reduced or eliminated with a drop-in inductor including one or more ground return conductors. For example, FIG. 42 shows a side cross-sectional view and FIG. 43 shows a top plan view of one drop-in inductor 4200 installed in an aperture of a PCB 4202. FIG. 44 shows a top perspective view of inductor 4200.

Figure 45:
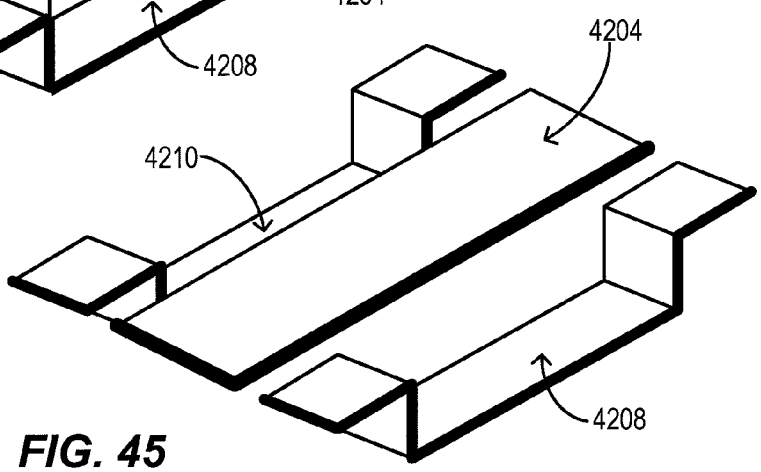
FIG. 45 shows a top perspective view of the inductor of FIGS. 42-44 with a magnetic core removed.

Inductor 4200 includes a winding 4204 wound at least partially around or through at least a portion of a magnetic core 4206 (e.g., formed of a ferrite and/or powdered iron material). Winding 4204, for example, extends through a channel in core 4206. FIG. 45 shows a top perspective view of inductor 4200 with core 4206 removed. Inductor 4200 also includes ground return conductors 4208, 4210. Outlines of winding 4204 and ground return conductors 4208, 4210 are shown by dashed lines in FIG. 43 where obscured by core 4206, and core 4206 is shown as transparent in FIG. 44. Winding 4204 and/or ground return conductors 4208, 4210 are, for example, foil conductors, as shown in FIGS. 42-45. Such foil conductors may, but need not be, sufficiently thick to be relatively rigid. Core 4206 does not form a magnetic path loop around ground return conductors 4208, 4210. Accordingly, inductance of ground return conductors 4208, 4210 is, for example, not significantly increased by presence of core 4206.

Inductor 4200 can be used, for example, to provide a path for return current, as shown by arrows 4304 in FIG. 43, as well as to provide a path for current to a load, as shown by arrow 4306. Thus, in contrast to prior art drop-in inductors, return current does not need to flow around inductor 4200—instead return current can flow through ground return conductors 4208, 4210 attached to inductor 4200.

In contrast to prior art drop-in inductors, use of inductor 4200 does not necessarily increase return path impedance. Ground return conductors 4208, 4210 are often of similar thickness to that of winding 4204 and are frequently ten to fifty times thicker than typical PCB trace foil thickness. Use of drop-in inductor 4200 may therefore significantly decrease return path impedance, despite a PCB aperture being required for inductor 4200. Furthermore, inductance of inductor 4200 is less affected by PCB layout than prior art drop-in inductors because return current flows through inductor 4200.

Moreover, because inductor 4200 provides a path for return current, a number of inductors 4200 can be spaced close together without having to allow for space between inductors for a return current path, such as spacing 4106 required between prior art drop-in inductors 4100 of FIG. 41. Ground return conductors 4208, 4210 may even allow a number of inductors 4200 to be placed in a single aperture. Accordingly, a number of inductors 4200 may require less space on a PCB than the same number of prior art drop-in inductors because inductors 4200 can be placed closer together than the prior art drop-in inductors, or a number of inductors 4200 can be placed in a common aperture.

Winding 4204 and ground return conductors 4208, 4210, for example, have respective solder tabs 4302 electrically coupled to their ends to facilitate surface mount connection of inductor 4200 to a PCB. Solder tabs 4302 are typically formed at the same height relative to a bottom surface 4212 of core 4206 to facilitate surface mount connection of inductor 4200 to a PCB. In some embodiments, solder tabs 4302 are extensions of winding 4204 or ground return conductors 4208, 4210, which may facilitate manufacturability of inductor 4200. For example, winding 4204 and its respective solder tabs 4302 may be formed of a single foil winding. Each of solder tabs 4302, for example, connect to PCB traces on a common PCB layer.

Inductor 4200 may be more mechanically robust than prior art drop-in inductors. For example, in embodiments where winding 4204 is a relatively rigid foil extending through a channel in core 4206, winding 4204 may provide significant mechanical support for inductor 4200. In contrast, the soft, multi-turn wire winding of prior art drop-in inductor 3900 typically provides little to no mechanical support for inductor 3900.

Additionally, ground return conductor 4208, 4210 may increase mechanical robustness of inductor 4200. For example, solder tabs 4302 coupled to ground return conductors 4208, 4210 may provide additional points to support inductor 4200 on a PCB, thereby reducing stress on inductor 4200's solder tabs and consequently reducing the likelihood of core 4206 cracking. For example, if each of winding 4204 and ground return conductors 4208, 4210 have respective solder tabs 4302 coupled to their ends, inductor 4200 may be supported on a PCB at six different places, as opposed to prior art inductor 3900, which is supported at only two places. Furthermore, ground return conductors 4208, 4210 may promote overall mechanical strength of inductor 4200.

Figure 46:
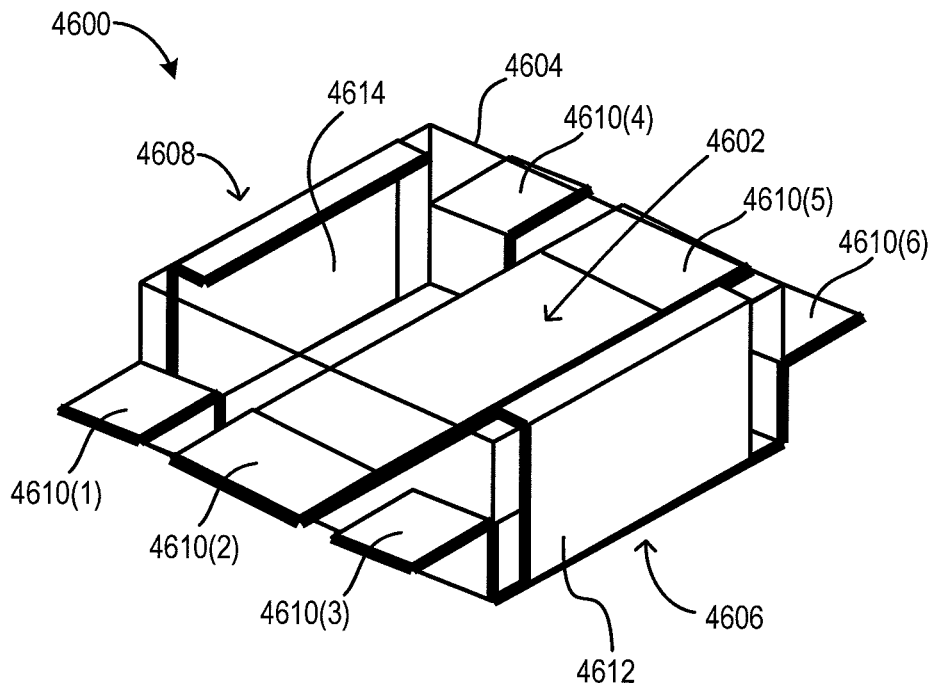
FIG. 46 shows a top perspective view of one drop-in inductor including ground return conductors, according to an embodiment.
Figure 47:
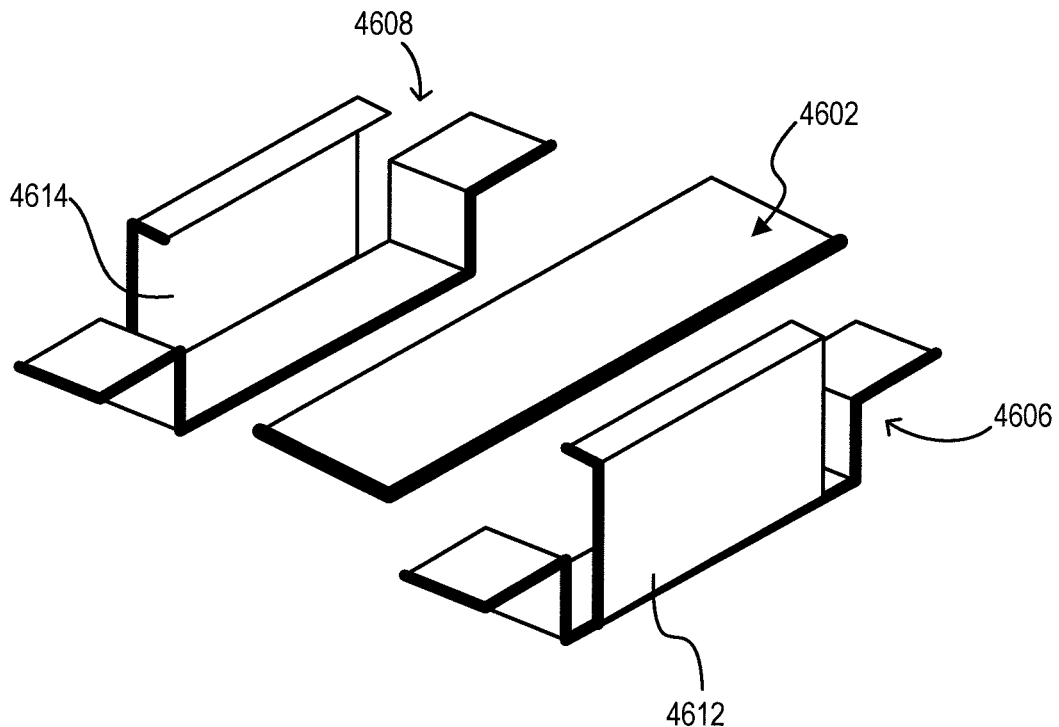
FIG. 47 shows an exploded perspective view of the inductor of FIG. 46 with a magnetic core removed.

Drop-in inductors with ground return conductors may have other configurations. For example, FIG. 46 shows a top perspective view of one drop-in inductor 4600, which is a variation of inductor 4200 (FIGS. 42-45). Inductor 4600 includes a winding 4602 wound at least partially around or through at least a portion of a magnetic core 4604 (shown as transparent in FIG. 46). Inductor 4600 further includes ground return conductors 4606, 4608. FIG. 47 is an exploded perspective view of inductor 4600 with magnetic core 4604 removed. A respective solder tab 4610 may be electrically coupled to each end of winding 4602 and ground return conductors 4606, 4608. Each of solder tabs 4610 are, for example, formed at the same height relative to a bottom surface of core 4604 to facilitate surface mount connection of inductor 4200 to a PCB.

Figure 48:
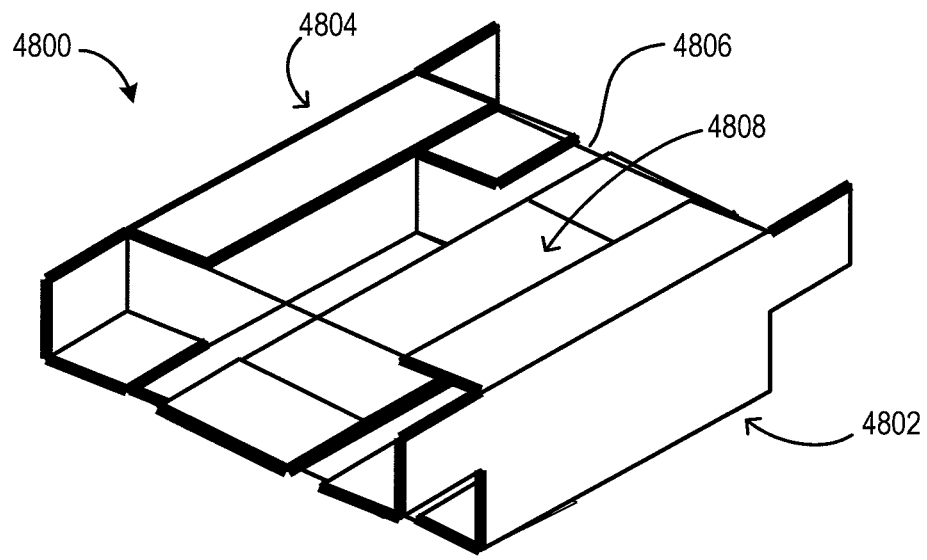
FIG. 48 shows a top perspective view of another embodiment of the inductor of FIGS. 46-47.
Figure 49:
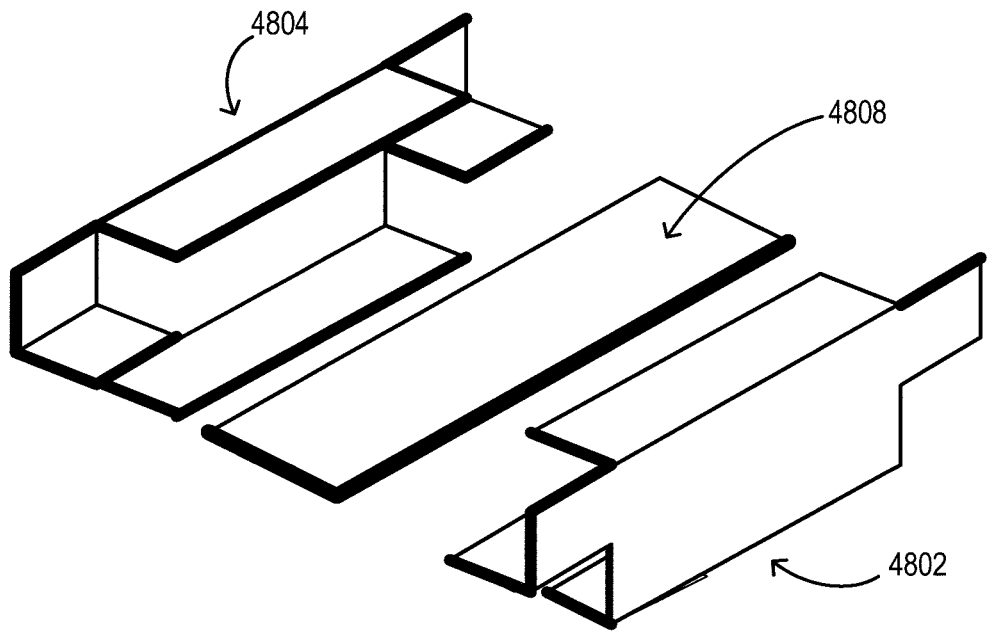
FIG. 49 shows an exploded perspective view of the inductor of FIG. 48 with a magnetic core removed.

Ground return conductors 4606, 4608 respectively include clamps 4612, 4614 which may allow for easier clamping of the ground return conductors to magnetic core 4604. Clamps 4612, 4614 may also increase robustness, physical attachment strength, and heat sinking ability of ground return conductors 4606, 4608. FIG. 48 shows a top perspective view of inductor 4800, which is an alternate embodiment of inductor 4600 including ground return conductors 4802, 4804 that provide enhanced clamping to magnetic core 4806 and enhanced conductivity. Winding 4808 is wound at least partially around or through a least a portion of core 4806, and core 4806 is shown as transparent in FIG. 48. FIG. 49 is an exploded perspective view of inductor 4800 with magnetic core 4806 removed.

Figure 50:
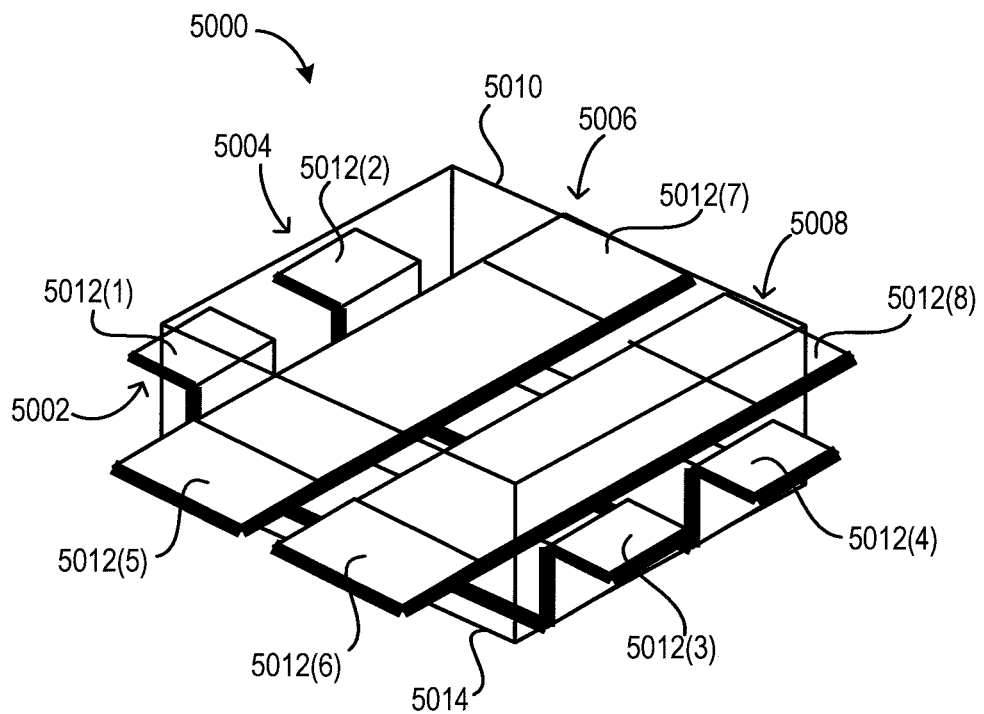
FIG. 50 shows a top perspective view of one drop-in coupled inductor including ground return conductors, according to an embodiment.
Figure 51:
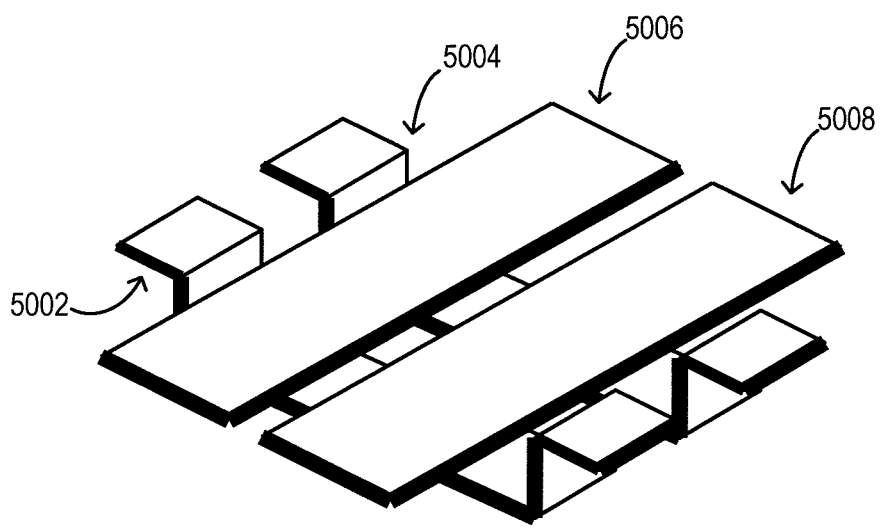
FIG. 51 shows a top perspective view of the inductor of FIG. 50 with a magnetic core removed.

The concept of adding ground return conductors to drop-in inductors can be extended to inductors including multiple, magnetically coupled windings. For example, FIG. 50 shows a top perspective view of a drop-in coupled inductor 5000 including ground return conductors 5002, 5004. Coupled inductor 5000 further includes windings 5006, 5008 wound at least partially around or through at least a portion of a magnetic core 5010 (shown as transparent in FIG. 50). FIG. 51 is a top perspective view of inductor 5000 with magnetic core 5010 removed. A respective solder tab 5012 is, for example, electrically coupled to each of ground return conductors 5002, 5004, and windings 5006, 5008. Solder tabs 5012 are, for example, formed at the same height relative to a bottom surface 5014 of core 5010 to facilitate surface mount connection of inductor 5000 to a PCB. Although inductor 5000 is shown as being a two winding coupled inductor, inductor 5000 could be extended to support three or more windings. Additional ground return conductors could also be added, or ground return conductors 5002, 5004 could be combined into a single conductor.

Figure 52:
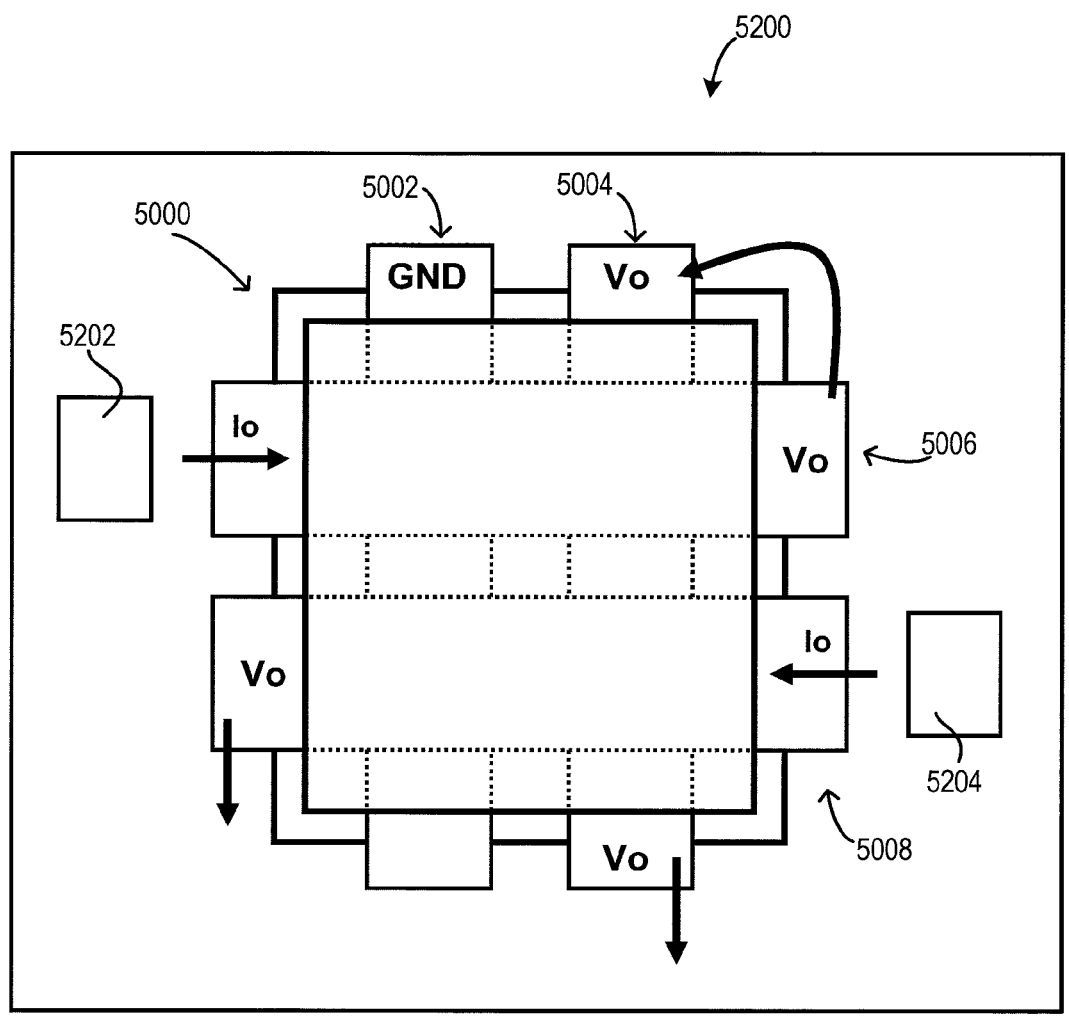
FIG. 52 shows a top plan view of one PCB assembly including an embodiment of the inductor of FIGS. 50-51.

FIG. 52 shows a top plan view of one PCB assembly 5200, which shows one possible application of coupled inductor 5000. In assembly 5200, not only do windings 5006, 5008 respectively carry current from power stages 5202, 5204 to a load, ground return conductor 5004 also carries current to the load. Ground return conductor 5002, however, serves to carry return current.

Figure 53:
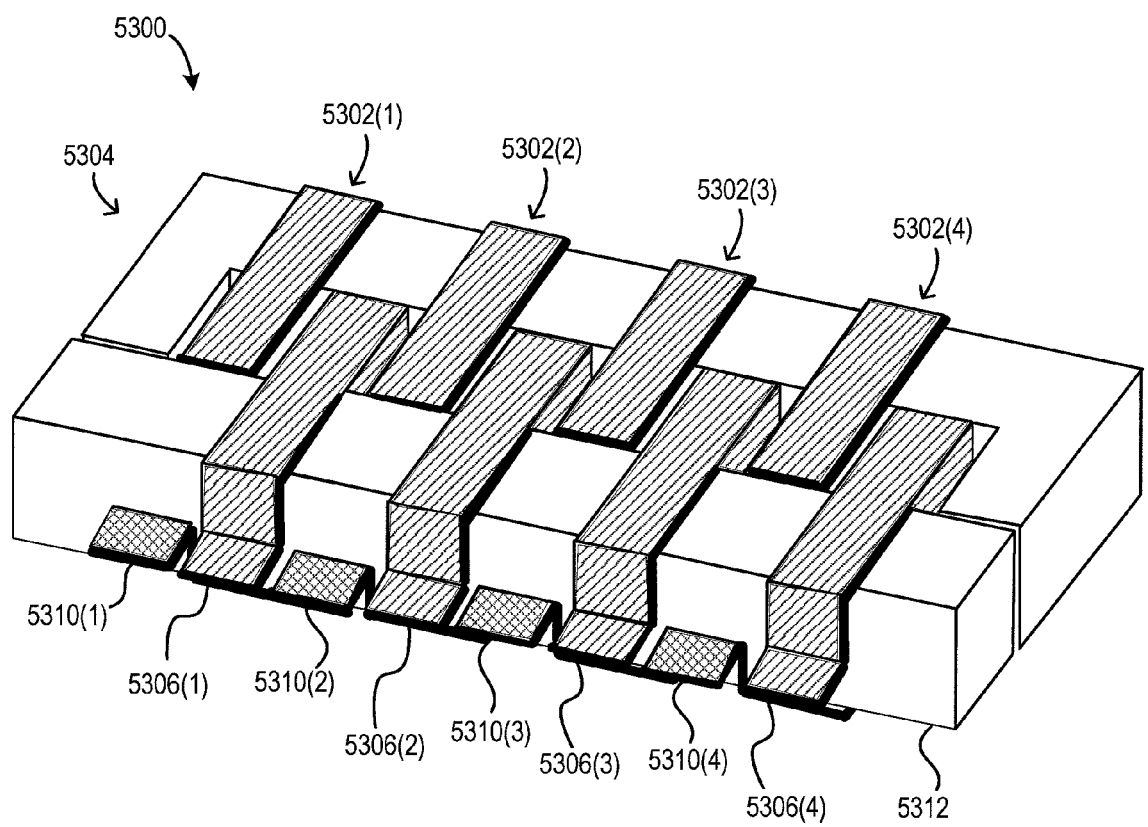
FIG. 53 shows a top perspective view of one N-winding coupled inductor including a ground return structure, according to an embodiment.
Figure 54:
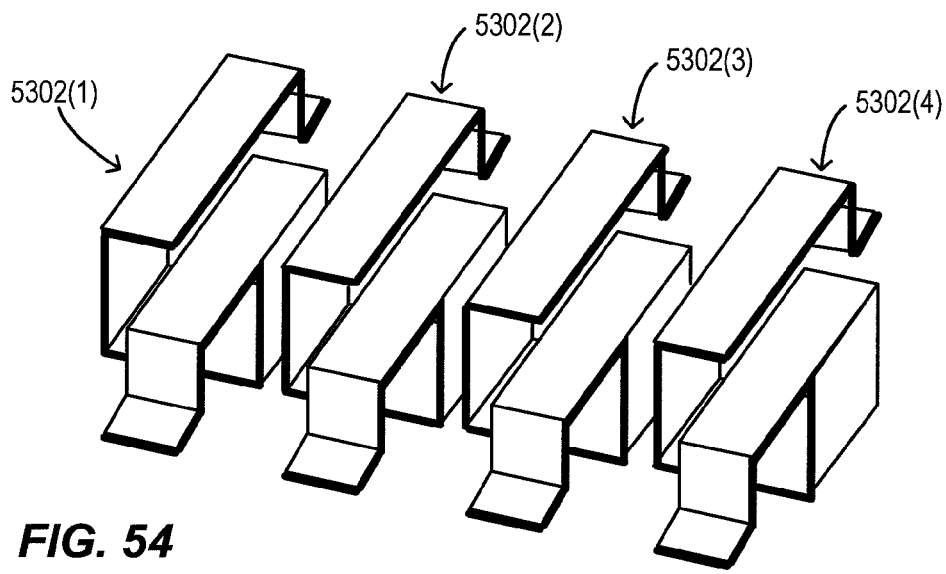
FIG. 54 shows a top perspective view of the windings of the inductor of FIG. 53.

FIG. 53 shows a top perspective view of one N-winding coupled inductor 5300, which is another example of a drop-in inductor including a ground return conductor. Inductor 5300 includes N windings 5302, where N is an integer greater than one. Although inductor 5300 is shown as including four windings, inductor 5300 could be modified to include any number of windings greater than one. Each winding 5302 is at least partially wound around a respective leg of a magnetic core 5304. A respective solder tab 5306 is electrically coupled to each end of each winding 5300. Solder tabs 5306 allow windings 5302 to be soldered to a PCB that inductor 5300 is installed in an aperture of. Solder tabs 5306 are, for example, extensions of their respective windings 5302. FIG. 54 shows a top perspective view of windings 5302.

Figure 55:
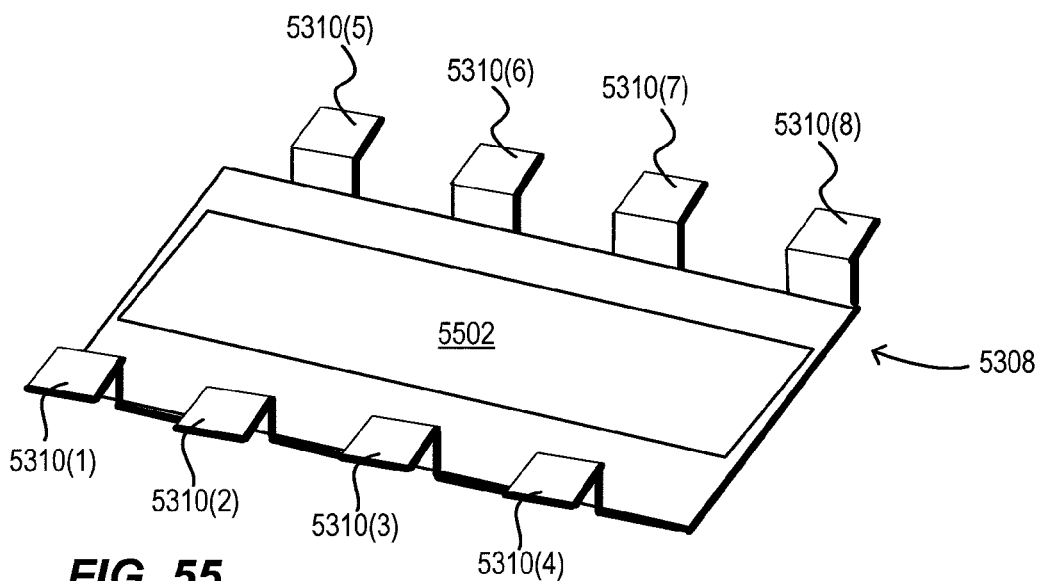
FIG. 55 shows a top perspective view of the ground return structure of the inductor of FIG. 53.

Inductor 5300 further includes a ground return current conductor in the form of a return current structure 5308 to provide a low impedance path for return current. FIG. 55 shows a top perspective view of structure 5308. Structure 5308 can also advantageously serve as a heat sink for inductor 5300 and a PCB that inductor 5300 is installed in. Structure 5308 includes, for example, several solder tabs 5310 for soldering to a PCB. Solder tabs 5306 and 5310 are, for example, formed at the same height relative to a bottom surface 5312 of core 5304 to facilitate surface mount connection of inductor 5300 to a PCB. Structure 5308 optionally includes an isolator 5502 to prevent structure 5308 from electrically shorting to windings 5302. Isolator 5502 is, for example, a dielectric coating or an isolating layer, such as dielectric tape. In the example of FIG. 53, structure 5308 is disposed on the bottom side of inductor 5300—accordingly, only solder tabs 5310 of structure 5308 are visible in FIG. 53.

Figure 56:
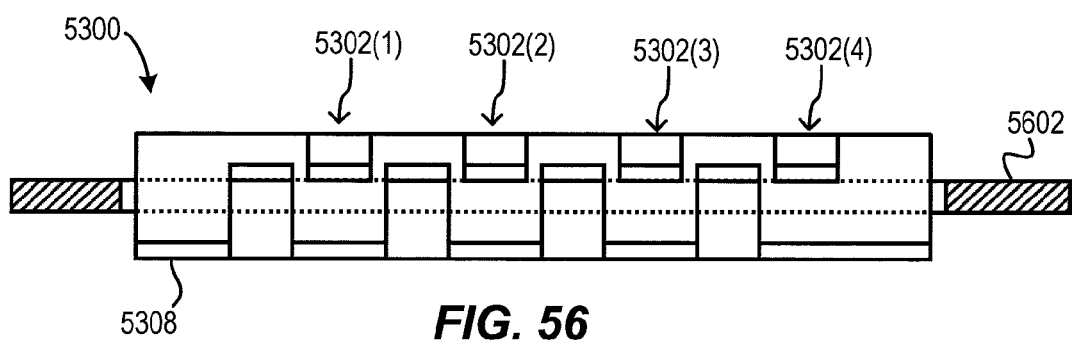
FIG. 56 shows an embodiment of the inductor of FIG. 53 installed in a PCB.

FIG. 56 shows an example of one possible application of inductor 5300. In particular, FIG. 56 is a side cross-sectional view of inductor 5300 installed in an aperture of a PCB 5602. The vertical position of inductor 5300 with respect to PCB 5602 could be varied by changing the dimensions of windings 5302 and structure 5308.

Figure 57:
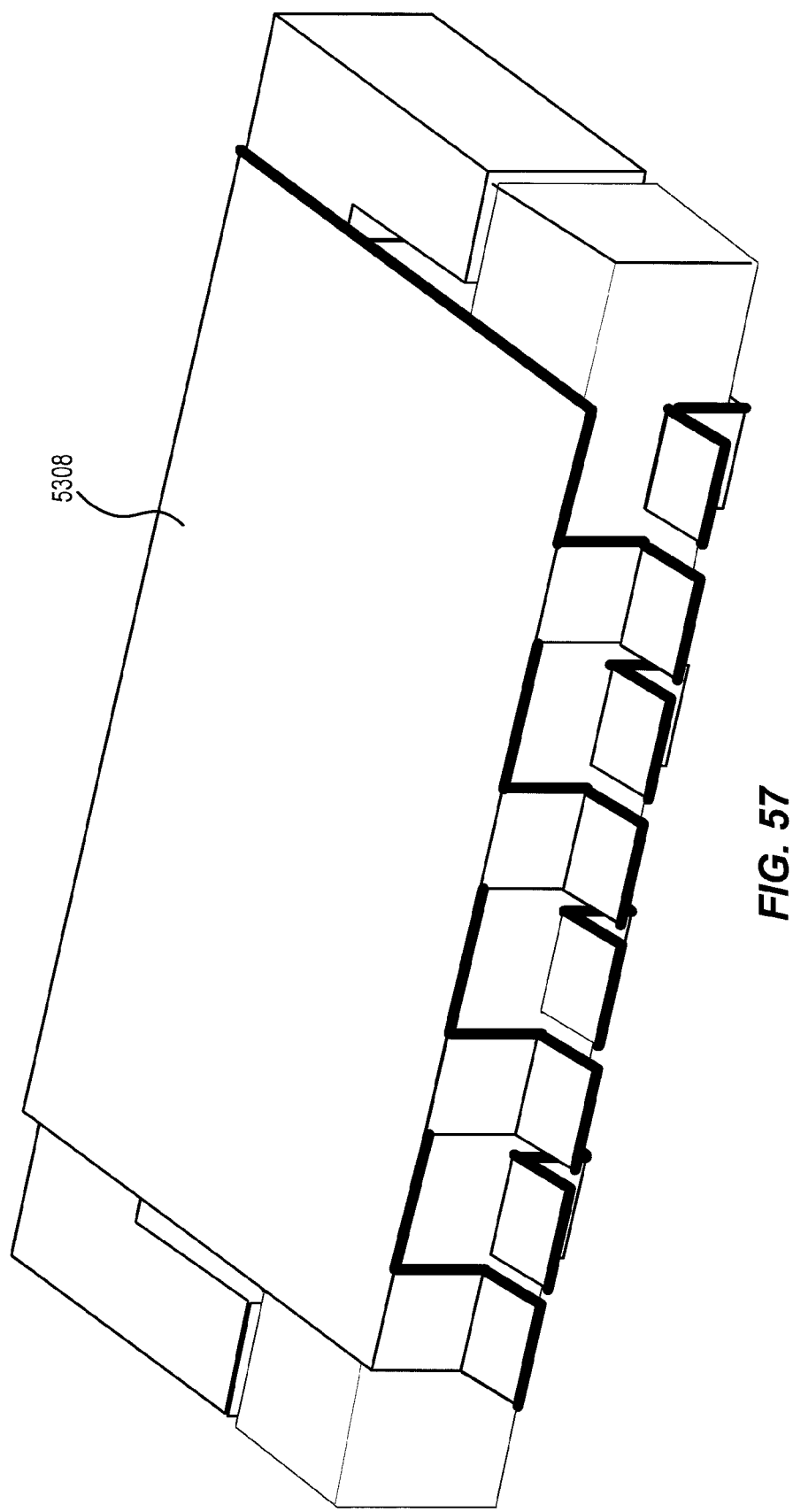
FIG. 57 shows an alternate embodiment of the inductor of FIG. 53.

Although return current structure 5308 is disposed on the bottom side of inductor 5300 in FIGS. 53 and 56, structure 5308 could alternately be disposed on the top side of inductor 5300, as shown in FIG. 57. Placing structure 5308 on the top side advantageously offers a flat (or substantially flat) surface to permit pick and place installation of inductor 5300 without a top side label. Placing structure 5308 on the top side of inductor 5300 may also facilitate cooling when there is more air flow on a particular side of the PCB.

Although structure 5308 is shown as a ground current return conductor, it could be modified to carry additional signals. For example, an alternate embodiment of structure 5308 includes two electrically isolated electrical conductors, where one conductor serves as a ground return conductor, and the other conductor serves as a low current power supply conductor (e.g., a conductor for a keep-alive power supply).

Figure 58:
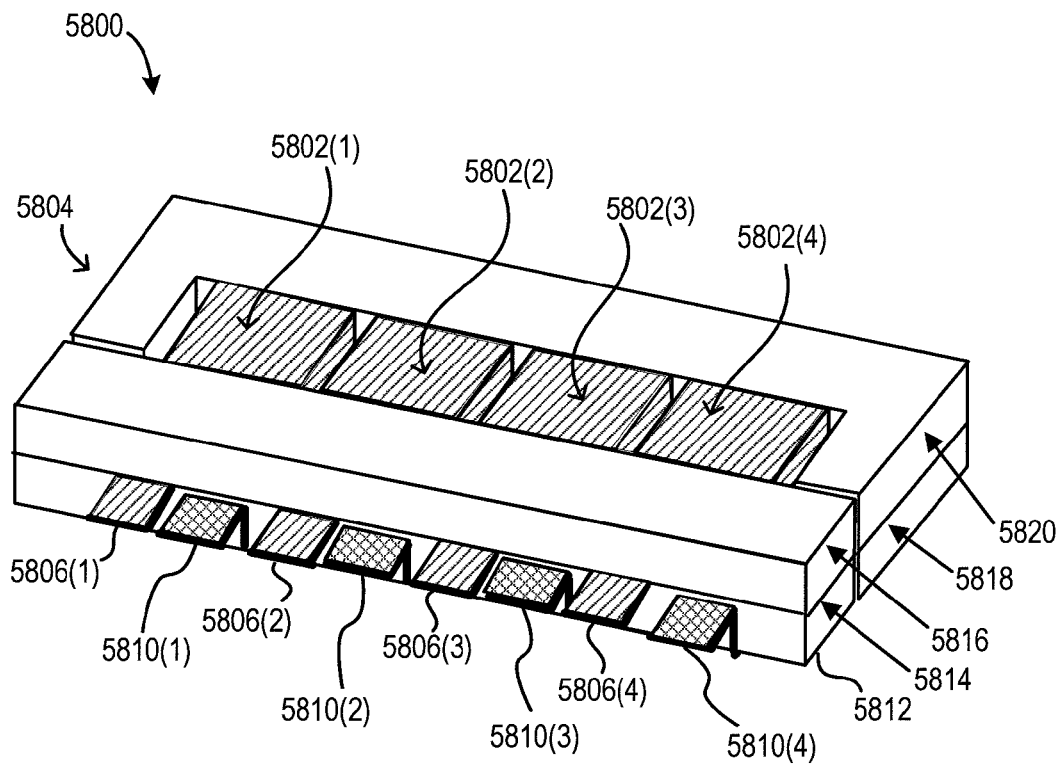
FIG. 58 shows a top perspective view of one N-winding coupled inductor including a ground return structure, according to an embodiment.
Figure 59:
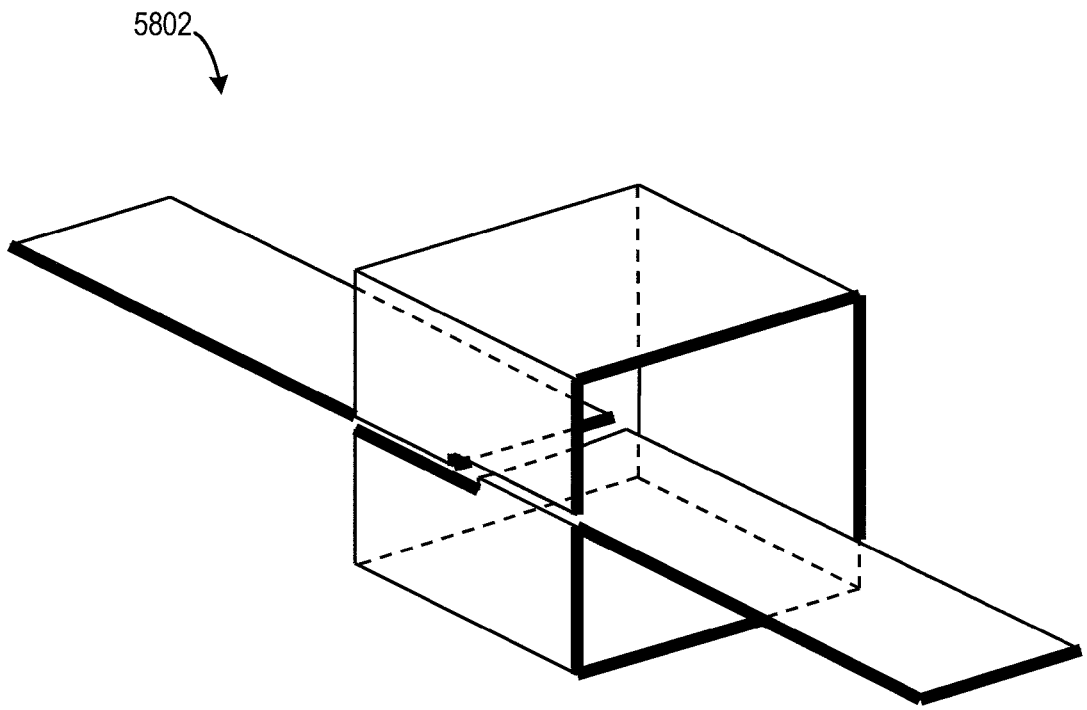
FIG. 59 shows a top perspective view of one winding of the inductor of FIG. 58.

FIG. 58 shows a top perspective view of one drop-in N-winding coupled inductor 5800, where N is an integer greater than one. Inductor 5800 is similar to inductor 5300 (FIG. 53); however windings 5802 of inductor 5800 have a shorter length and thus a lower resistance than windings 5302 of inductor 5300. FIG. 59 shows a top perspective view of one winding 5802 which is, for example, symmetrical in order to reduce winding length. Inductor 5800 includes a magnetic core 5804, and a respective solder tab 5806 is electrically coupled to each end of each winding 5802. Similar to inductor 5300, inductor 5800 includes a ground return structure 5808, which, for example, includes several solder tabs 5810. Solder tabs 5806 and 5810 may be formed at the same height relative to a bottom surface 5812 of core 5804 to facilitate surface mount connection of inductor 5800 to a PCB.

Core 5804 is, for example, formed of pairs of corresponding magnetic elements 5814, 5816 and 5818, 5820, as shown in FIG. 58. In such embodiments, solder tabs 5806 extend from spaces between corresponding magnetic elements 5814, 5816 and 5818, 5820. In embodiments where windings 5802 are symmetrical, each of corresponding magnetic elements 5814, 5816 and 5818, 5820 have, for example, an identical shape and size.

Figure 60:
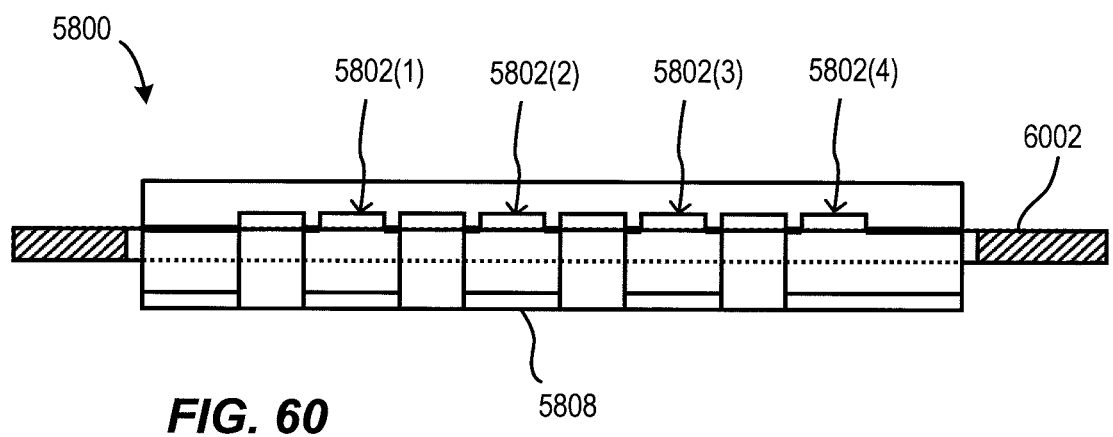
FIG. 60 shows an embodiment of the inductor of FIG. 58 installed in a PCB.
Figure 61:
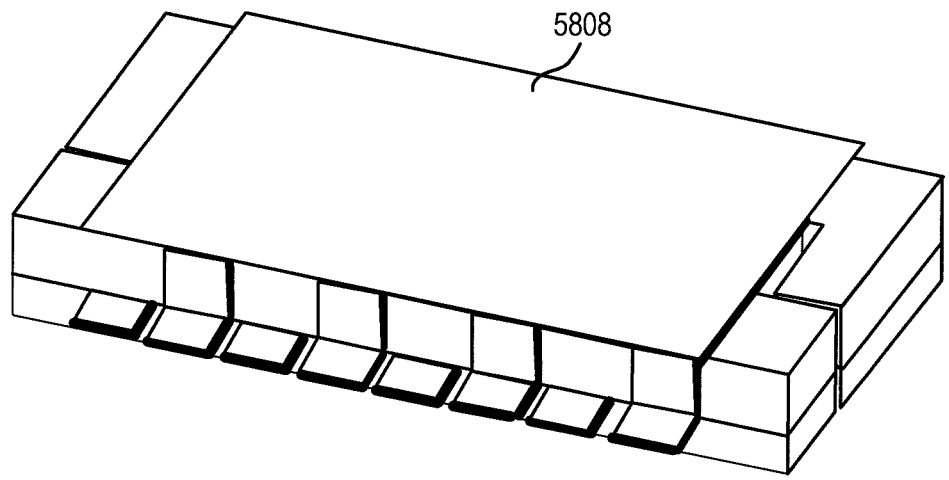
FIG. 61 shows an alternate embodiment of the inductor of FIG. 58.

FIG. 60 shows an example of one possible application of inductor 5800. In particular, FIG. 60 is a side cross-sectional view of inductor 5800 installed in an aperture of a PCB 6002. The vertical position of inductor 5800 with respect to PCB 6002 could be varied by changing the dimensions of windings 5802 and structure 5808. Although ground return structure 5808 is installed on the bottom side of inductor 5800 in FIGS. 58 and 60, structure 5808 could be installed on the top side of inductor 5800, as shown in FIG. 61.

As discussed above, use of prior art drop-in inductors typically results in problems including significantly increased return current path impedance, poor mechanical robustness, and the need to separate multiple instances of the prior art drop-in inductors. However, drop-in inductors with ground return conductors, such as some embodiments of the inductors discussed above, may reduce or eliminate one or more of these problems, as previously discussed. Accordingly, the addition of ground return conductors to drop-in inductors may allow for use of drop-in inductors in applications where prior art drop-in inductors would be impractical. Use of drop-in inductors instead of standard (non drop-in) surface mount inductors may offer a number of advantages, such as the following: (1) reduced inductor height relative to the PCB surface; (2) increased inductor core size and cross section, which helps minimize core loss; (3) reduced PCB surface area required for the inductors; and/or (4) inductor height being closer to that of other power supply components, resulting in improved power supply volume utilization.

Adding one or more ground return conductors to a drop-in inductor may also significantly reduce or eliminate inductance dependence on layout and/or PCB aperture configuration. In particular, adding one or more ground return conductors to a drop-in inductor helps minimize length of the inductor's current loop in output inductor applications, where the current loop is defined by the path current takes when flowing through the inductor to a load, and from the load back by the inductor. Inductance is affected by the current loop's configuration, and increasing the current loop's size generally increases inductance. Accordingly, by minimizing current loop length through use of ground return conductors, current loop length may be significantly or completely unaffected by PCB layout and/or aperture configuration, thereby reducing or eliminating inductance dependence on such application characteristics. In contrast, in the prior art drop-in inductor of FIGS. 39-41, current loop size is significantly dependent on PCB layout and aperture configuration. For example, in the case of prior art inductor 3900 (FIGS. 39-40), inductor 3900's inductance will change if the size of aperture 3902 or the PCB layout around aperture 3902 is changed.

Figure 62:
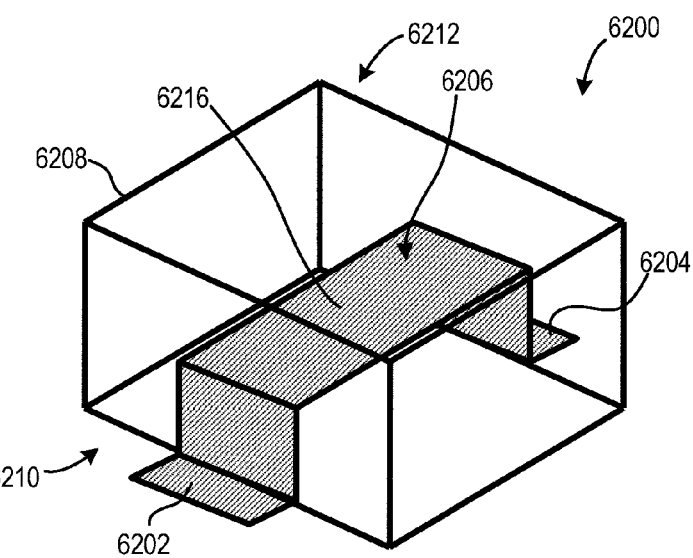
FIGS. 62-64 respectively show a perspective, a side plan, and a top plan view of an inductor including two extended tongues, according to an embodiment.
Figure 63:
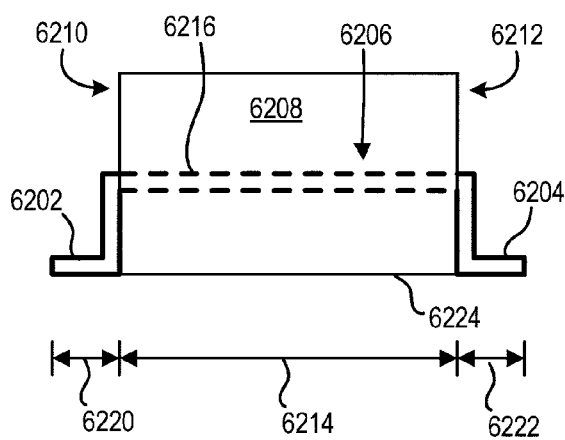
Figure 64:
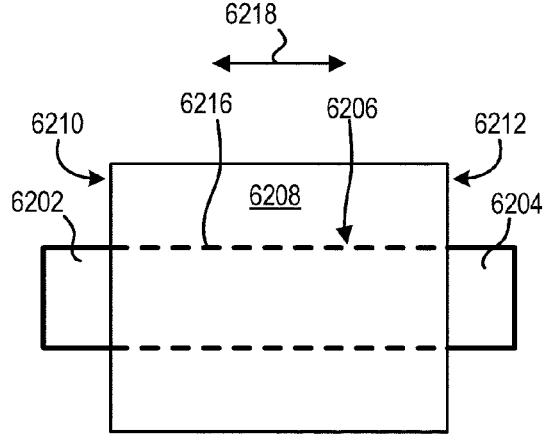

FIGS. 62-64 respectively show a perspective, a side plan, and a top plan view of an inductor 6200. Inductor 6200 is similar to inductor 500 (FIG. 5), but with foil extended input and output tongues 6202, 6204 of at least substantially the same length. Inductor 6200 includes a foil winding 6206 and a core 6208 formed of magnetic material. Core 6208 has a first side 6210 opposite to a second side 6212. A linear separation distance between first and second sides 6210, 6212 of core 6208 defines a length 6214 of core 6208.

Foil winding 6206 including a core winding portion 6216 wound through core 6208. Extended input and output tongues 6202, 6204 are electrically coupled to opposite respective ends of foil winding 6206. In certain embodiments, input and output tongues 6202, 6204 are each an extension of winding 6206. Input tongue 6202 is at first side 6210 of core 6208 and extends away from core 6208 in a lengthwise direction 6218, and output tongue 6204 is at second side 6212 of core 6208 and extends away from core 6208 in lengthwise direction 6218. Dashed lines indicate the outline of winding 6206 where obscured by core 6208. Extended input and output tongues 6202, 6204, for example, supplement or serve as a substitute for respective foil traces disposed on a surface of a printed circuit board. For example, one or more of input and output tongues 6202, 6204 may be configured for soldering to and extending along respective PCB foil traces.

Extended input tongue 6202 has a length 6220, and extended output tongue 6204 has a length 6222. Length 6220 is at least substantially equal to length 6222. In certain embodiments, each of lengths 6220, 6222 of tongues 6202, 6204 are less than length 6214 of core 6208. Each of tongues 6202, 6204 are formed at a same height relative to a bottom surface 6224 of core 6208 to facilitate surface mount soldering of tongues 6202, 6204 to a PCB.

Figure 65:
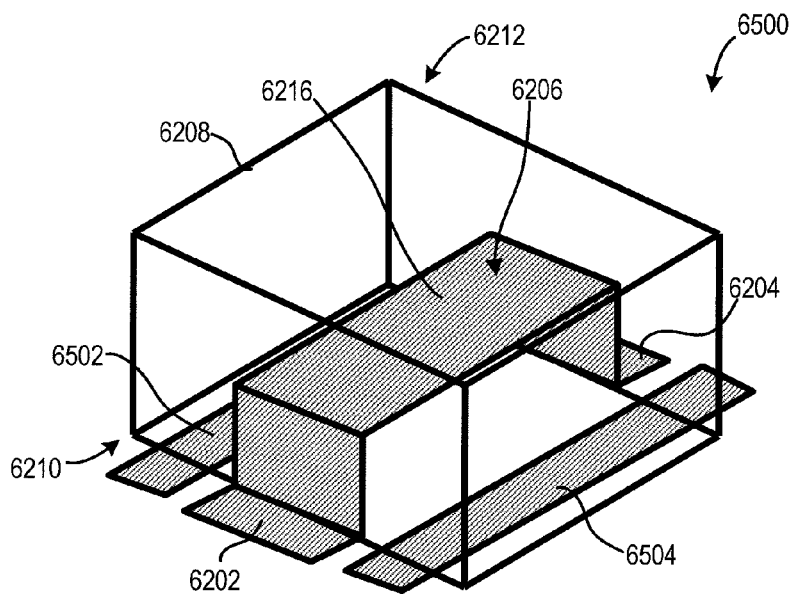
FIGS. 65-67 respectively show a perspective, a side plan, and a top plan view of an embodiment of the inductor of FIGS. 62-64 including ground return conductors.
Figure 66:
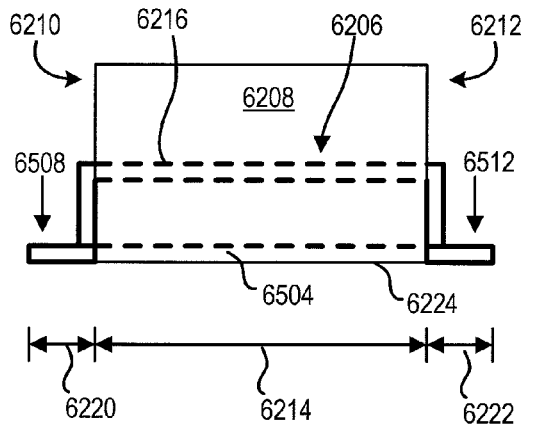
Figure 67:
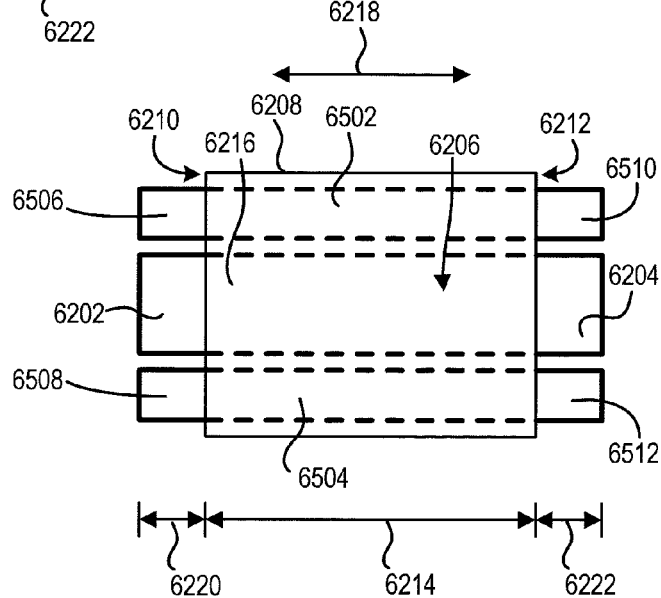

FIGS. 65-67 respectively show a perspective, a side plan, and a top plan view of an inductor 6500, which is an alternate embodiment of inductor 6200 (FIGS. 62-64), and includes two ground return conductors 6502, 6504. Inductor 6500 is similar to inductor 1500 (FIGS. 15-17), but with ground return conductor extensions and extended input and output tongues of at least substantially equal length. Ground return conductors 6502, 6504 attach to bottom surface 6224 of core 6208, and core 6208 does not form a magnetic path loop around ground return conductors 6502, 6504. Accordingly, inductance of ground return conductors 6502, 6504 is not significantly increased by presence of core 6208, while inductance of winding 6206 is increased by presence of core 6208, relative to an otherwise identical inductor without core 6208. As can be seen in FIGS. 65 and 67, ground return conductors 6502, 6504 are each adjacent foil winding 6206 in lengthwise direction 6218.

Both of ground return conductors 6502, 6504 include a respective first extension 6506, 6508 at first side 6210 of core 6208 and extending away from core 6208 in lengthwise direction 6218. Similarly, both of ground return conductors 6502, 6504 includes a respective second extension 6510, 6512 at second side 6212 of core 6208 and extending away from core 6208 in lengthwise direction 6218. Each extension 6506, 6508, 6510, 6512, as well as extended input and output tongues 6202, 6204, are formed at a same height relative to bottom surface 6224 of core 6208 to facilitate surface mount soldering to a PCB. Each first extension 6506, 6508 has the same length 6220 as extended input tongue 6202, and each second extension 6510, 6512 has the same length 6222 as extended output tongue 6204. As discussed above, each of extended input and output tongues 6202, 6204 has the same length, and each extension 6506, 6508, 6510, 6512 therefore has the same length as each tongue.

Figure 68:
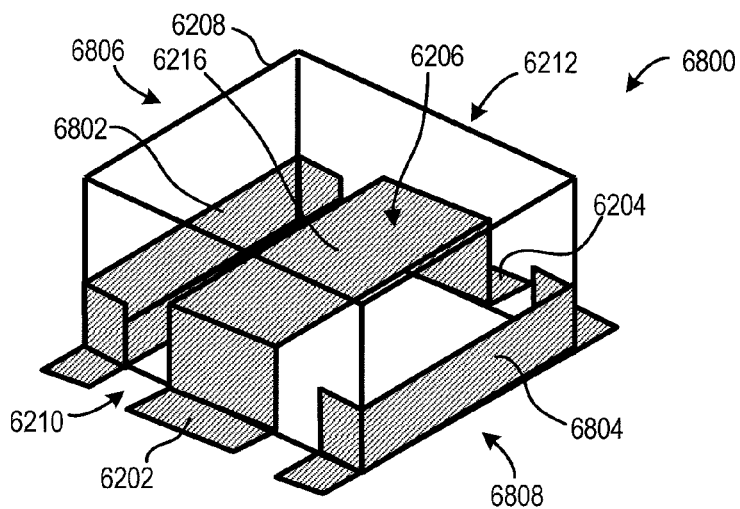
FIG. 68 shows a perspective view of an inductor similar to the inductor FIGS. 65-67, according to an embodiment.

FIG. 68 shows a perspective view of an inductor 6800, which is similar to inductor 6500 (FIGS. 65-67), but with an alternative ground return conductor configuration. Inductor 6800 includes ground return conductors 6802, 6804, which are similar to the ground return conductors of inductor 6500, but extend up at least partially along sides 6210, 6212, 6806, 6808 of core 6208, as shown in FIG. 68. Such extensions of ground return conductors 6802, 6804 along sides of core 6208 advantageously promote mechanical robustness of inductor 6800 and also increase the effective cross sectional area of ground return conductors 6802, 6804. Increased ground return conductor 6802, 6804 cross sectional area promotes low impedance of the ground return conductors, as well as cooling of inductor 6800 and a PCB in contact with inductor 6800. Furthermore, the portions of ground return conductors 6802, 6804 that extend along sides of core 6208 are exposed (i.e., do not contact a PCB) in typical applications, and therefore are particularly effective in cooling inductor 6800.

Figure 69:
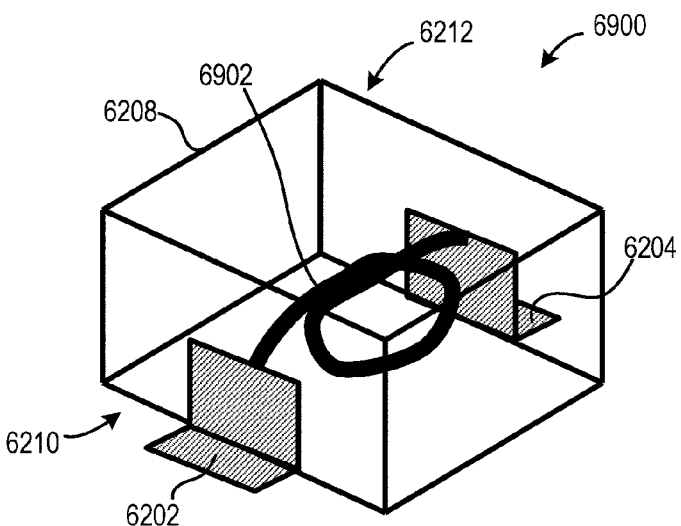
FIG. 69 shows a perspective view of an inductor similar to the inductor of FIGS. 62-64, according to an embodiment.
Figure 70:
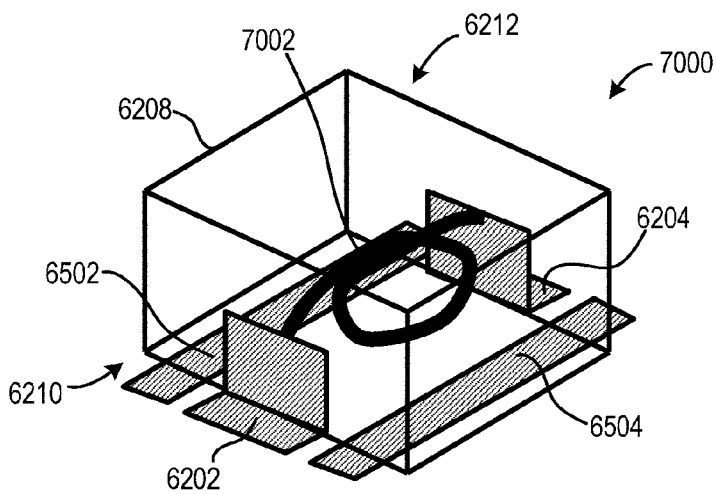
FIG. 70 shows a perspective view of another inductor similar to the inductor of FIGS. 65-67, according to an embodiment.

In certain embodiments of the inductors disclosed herein, the core is formed of a powder magnetic material, such as powdered iron within a binder, and the one or more windings are at least partially embedded in the core. For example, FIG. 69 shows a perspective view of inductor 6900, which is similar to inductor 6200 (FIGS. 62-64), but with foil core winding portion 6216 replaced with a wire core winding portion 6902 embedded in core 6208. As another example, FIG. 70 shows a perspective view of inductor 7000, which is similar to inductor 6500 (FIGS. 65-67), but with foil core winding portion 6216 replaced with a wire core winding portion 7002 embedded in core 6208.

It is anticipated that the foil windings and ground return conductors described herein are considerably thicker, and thereby offer considerably lower sheet resistivity, than the one-ounce copper foil used on many printed circuit boards. It is further anticipated that the foil windings and ground return conductors described herein are made from a highly conductive material comprising primarily copper. In alternative embodiments, the foil windings and ground return conductors are made from a non-cuprous metal such as aluminum or steel having a solderable low resistance coating of copper, and in may in turn be plated with tin or an alloy comprising tin for enhanced solderability.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. An inductor for assembly on a printed circuit board, comprising:
   a core formed of a magnetic material; and
   a first foil winding wound at least partially around or through at least a portion of the core, a first end of the first winding extending away from the core to form a first extended output tongue, a second end of the first winding forming a solder tab,
   the solder tab and at least a portion of the first extended output tongue formed at a same height relative to a bottom surface of the core for surface mount attachment to the printed circuit board, and
   the first extended output tongue configured and arranged to supplement or serve as a substitute for a first foil trace disposed on a surface of the printed circuit board.

2. The inductor of claim 1, the first extended output tongue having a length of at least about one centimeter.

3. The inductor of claim 2, the first winding comprising a single turn winding wound through an opening in the core.

4. The inductor of claim 3, the first extended output tongue having a width of at least about one millimeter.

5. The inductor of claim 4, the width of the first extended output tongue being greater than a width of the first winding.

6. The inductor of claim 2, further comprising a second winding wound at least partially around or through at least a portion of the core, a first end of the second winding extending away from the core to form a second extended output tongue configured and arranged to supplement or serve as a substitute for a second foil trace disposed on the surface of the printed circuit board.

7. An inductor for assembly on a printed circuit board, comprising:
   a core formed of a magnetic material; and
   a first foil winding wound at least partially around or through at least a portion of the core, a first end of the first winding extending away from the core to form a first extended output tongue, a second end of the first winding extending away from the core to form a first extended input tongue, at least respective portions of the first extended output tongue and the first extended input tongue formed at a same height relative to a bottom surface of the core for surface mount attachment to the printed circuit board, the first extended output tongue configured and arranged to supplement or serve as a substitute for a first foil trace disposed on a surface of the printed circuit board, and the first extended input tongue configured and arranged to supplement or serve as a substitute for a second foil trace disposed on the surface of the printed circuit board.

8. The inductor of claim 7, the first extended output tongue having a length of at least about one centimeter.

9. The inductor of claim 8, further comprising a second winding wound at least partially around or through at least a portion of the core, a first end of the second winding extending away from the core to form a second extended output tongue, a second end of the second winding extending away from the core to form a second extended input tongue, each of the second extended output tongue and the second extended input tongue configured and arranged to supplement or serve as a substitute for a respective foil trace disposed on the surface of the printed circuit board.

10. An inductor for assembly on a printed circuit board, comprising:
a core formed of a magnetic material;
a first winding wound at least partially around or through at least a portion of the core; and
a first ground return conductor attached to the core,
the first winding and the first ground return conductor configured and arranged such that inductance of the first ground return conductor is not significantly increased by presence of the core, while inductance of the first winding is significantly increased by presence of the core, relative to an otherwise identical inductor without the core.

11. The inductor of claim 10, the first winding being a foil winding, a first end of the first winding extending away from the core to form an extended output tongue, at least respective portions of the extended output tongue and the first ground return conductor formed at a same height relative to a bottom surface of the core for surface mount attachment to the printed circuit board, the extended output tongue configured and arranged to supplement or serve as a substitute for a first foil trace disposed on a surface of the printed circuit board.

12. The inductor of claim 11, a second end of the first winding extending away from the core to form an extended input tongue, at least respective portions of the extended input tongue, the extended output tongue, and the first ground return conductor formed at a same height relative to the bottom surface of the core, the extended input tongue configured and arranged to supplement or serve as a substitute for a second foil trace disposed on the surface of the printed circuit board.

13. The inductor of claim 11, the first ground return conductor extending along at least a portion of the extended output tongue.

14. The inductor of claim 13, further comprising a second ground return conductor attached to the core and extending along at least a portion of the extended output tongue, the second ground return conductor configured and arranged such that inductance of the second ground return conductor is not significantly increased by presence of the core, relative to an otherwise identical inductor without the core.

15. The inductor of claim 14, further comprising a second winding wound at least partially around or through at least a portion of the core.

16. The inductor of claim 13, further comprising an isolator connecting the extended output tongue and the first ground return conductor.

17. The inductor of claim 16, the extended output tongue being vertically displaced from the first ground return conductor external to the core to magnetically couple together the extended output tongue and the first ground return conductor.

18. The inductor of claim 17, the isolator being formed of a magnetic material that contributes to leakage inductance of the first winding.

19. The inductor of claim 10, wherein:
each end of the first winding has a respective solder tab electrically coupled thereto;
each end of the first ground return conductor has a respective solder tab electrically coupled thereto; and
each solder tab is formed at a same height relative to a bottom surface of the core for surface mount attachment to the printed circuit board.

20. The inductor of claim 19, the inductor being a drop-in inductor, and each of the solder tabs being displaced from the bottom surface of the core.

21. The inductor of claim 20, further comprising a second ground return conductor attached to the core, the second ground return conductor configured and arranged such that inductance of the second ground return conductor is not significantly increased by presence of the core, relative to an otherwise identical inductor without the core.

22. The inductor of claim 21, each of the first and second ground return conductors comprising a clamp for fastening the ground return conductor to the core.

23. The inductor of claim 20, further comprising a second winding wound at least partially around or through at least a portion of the core.

24. The inductor of claim 20, each of the solder tabs electrically coupled to the first winding being an extension of the first winding.

25. The inductor of claim 20, the first winding being a foil winding passing through a channel formed by the core.

26. The inductor of claim 10, further comprising a second winding wound at least partially around or through at least a portion of the core, the first ground return conductor comprising a ground return structure attached to one of a top surface and a bottom surface of the core, the ground return structure being separated from the first and second winding via an insulating layer.

27. The inductor of claim 26, the ground return structure comprising a plurality of solder tabs.

28. The inductor of claim 10, the core comprising a plurality of magnetic sections attached to the first ground return conductor, the first winding wound through a respective channel in each of the plurality of magnetic sections.

29. The inductor of claim 28, further comprising a second ground return conductor attached to the plurality of magnetic sections, the second ground return conductor configured and arranged such that inductance of the second ground return conductor is not significantly increased by presence of the core, relative to an otherwise identical inductor without the core.

30. An inductor for assembly on a printed circuit board, comprising:
an elongated ground return conductor forming at least one solder tab at each end of the conductor;
at least two spacer elements disposed on the ground return conductor; and an elongated foil winding forming at least one solder tab at each end of the winding, the winding disposed on the spacer elements such that the spacer elements separate the ground return conductor from the winding to create a channel between the ground return conductor and the winding.

31. The inductor of claim 30, the ground return conductor being disposed parallel to the winding throughout the channel.

32. The inductor of claim 30, the spacer elements being formed of a magnetic material to increase inductance of the inductor.

* * * * *